(12) United States Patent
Yeo et al.

(10) Patent No.: US 12,336,350 B2
(45) Date of Patent: Jun. 17, 2025

(54) HIGH RESOLUTION DISPLAY DEVICE WITH REDUCED CURRENT CONSUMPTION AND LOAD

(71) Applicant: Samsung Display Co., LTD., Yongin-si (KR)

(72) Inventors: So Young Yeo, Yongin-si (KR); Dae Ho Song, Yongin-si (KR); Soo Chul Kim, Yongin-si (KR); Jin Taek Park, Yongin-si (KR); Ok Yi Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 567 days.

(21) Appl. No.: 17/550,490

(22) Filed: Dec. 14, 2021

(65) Prior Publication Data

US 2022/0352442 A1 Nov. 3, 2022

(30) Foreign Application Priority Data

Apr. 30, 2021 (KR) .................. 10-2021-0056891
Jun. 4, 2021 (KR) .................. 10-2021-0073064

(51) Int. Cl.
*H10H 20/857* (2025.01)
*H10H 20/01* (2025.01)
(Continued)

(52) U.S. Cl.
CPC .......... *H10H 20/857* (2025.01); *H10H 20/01* (2025.01); *H10H 20/831* (2025.01);
(Continued)

(58) Field of Classification Search
CPC ..... H01L 33/62; H01L 27/156; H01L 33/005; H01L 33/38; H01L 2933/0016; H01L 2933/0066; H01L 33/0093; H01L 33/60; H01L 2933/0058; H01L 33/44; H01L 33/507; H01L 2933/0025; H01L 2933/0041; H01L 25/0753; H10H 20/857; H10H 20/01; H10H 20/831; H10H 29/142; H10H 20/032; H10H 20/0364; H10H 20/034; H10H 20/0363; H10H 20/018;
(Continued)

(56) References Cited

U.S. PATENT DOCUMENTS 9,385,345 B2 * 7/2016 Lee .................. H10K 50/156
10,008,645 B2 6/2018 Bonar et al.
(Continued)

FOREIGN PATENT DOCUMENTS

KR 101296946 B1 8/2013
KR 1020170033493 A 3/2017
(Continued)

*Primary Examiner* — Caleb E Henry
(74) *Attorney, Agent, or Firm* — KILE PARK REED & HOUTTEMAN PLLC

(57) ABSTRACT

A display device includes a common electrode; light emitting elements including anodes commonly and electrically connected to the common electrode; first contact electrodes respectively electrically connected to cathodes of the light emitting elements; a circuit substrate; and second contact electrodes disposed on the circuit substrate and respectively electrically connected to the first contact electrodes and the common electrode.

6 Claims, 31 Drawing Sheets

(51) Int. Cl.
*H10H 20/831* (2025.01)
*H10H 29/14* (2025.01)

(52) U.S. Cl.
CPC ......... *H10H 29/142* (2025.01); *H10H 20/032* (2025.01); *H10H 20/0364* (2025.01)

(58) Field of Classification Search
CPC ............... H10H 20/0361; H10H 20/84; H10H 20/8515; H10H 20/856
See application file for complete search history.

(56) References Cited

U.S. PATENT DOCUMENTS

| | | | | |
|---|---|---|---|---|
| 10,256,438 | B2* | 4/2019 | Kim | H10K 59/80524 |
| 10,636,349 | B2* | 4/2020 | Shin | H04N 25/76 |
| 2008/0258167 | A1* | 10/2008 | Liu | H05K 1/0203 |
| | | | | 257/E33.056 |
| 2009/0316409 | A1* | 12/2009 | Kim | H05K 1/0295 |
| | | | | 362/249.14 |
| 2013/0320361 | A1* | 12/2013 | Huang | H01L 25/0753 |
| | | | | 257/88 |
| 2015/0084072 | A1* | 3/2015 | Huang | H10H 20/855 |
| | | | | 438/27 |
| 2017/0077348 | A1 | 3/2017 | Lim et al. | |
| 2017/0263594 | A1* | 9/2017 | Chung | H10H 20/8506 |
| 2017/0294479 | A1* | 10/2017 | Cha | H10H 20/81 |
| 2018/0019428 | A1* | 1/2018 | Kawamura | H10K 50/13 |
| 2018/0122870 | A1* | 5/2018 | Park | H10K 50/11 |
| 2018/0375058 | A1* | 12/2018 | Kawamura | H10K 50/13 |
| 2019/0006335 | A1* | 1/2019 | Lee | H01L 23/60 |
| 2019/0044023 | A1* | 2/2019 | Cheng | H10H 20/01 |
| 2019/0148409 | A1* | 5/2019 | Bang | G09G 3/32 |
| | | | | 345/173 |
| 2021/0118855 | A1 | 4/2021 | Kusunoki et al. | |
| 2022/0069000 | A1* | 3/2022 | Lo | H01L 33/005 |
| 2022/0231080 | A1* | 7/2022 | Li | H01L 25/0753 |
| 2022/0352249 | A1* | 11/2022 | Park | G09G 3/2003 |

FOREIGN PATENT DOCUMENTS

| | | |
|---|---|---|
| KR | 10-2018-0024228 | 3/2018 |
| KR | 10-2018-0118488 | 10/2018 |
| KR | 1020180134805 A | 12/2018 |
| KR | 10-1968592 | 4/2019 |
| KR | 10-2021-0009326 | 1/2021 |

* cited by examiner

170: 170a, 170b

HIGH RESOLUTION DISPLAY DEVICE WITH REDUCED CURRENT CONSUMPTION AND LOAD

CROSS-REFERENCE TO RELATED APPLICATION(S)

This application claims priority to and benefits of Korean Patent Application No. 10-2021-0056891 under 35 U.S.C. § 119 filed on Apr. 30, 2021 in the Korean Intellectual Property Office and Korean Patent Application No. 10-2021-0073064 under 35 U.S.C. § 119 filed on Jun. 4, 2021 in the Korean Intellectual Property Office, the entire contents of which are incorporated herein by reference.

BACKGROUND

1. Technical Field

The disclosure relates to a display device and a manufacturing method thereof.

2. Description of the Related Art

Recently, as interest in an information display is increasing, research and development for display devices are being continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a high resolution display device that may reduce current consumption and a load.

An embodiment provides a display device that may include a common electrode; light emitting elements including anodes commonly and electrically connected to the common electrode; first contact electrodes respectively electrically connected to cathodes of the light emitting elements; a circuit substrate; and second contact electrodes disposed on the circuit substrate and respectively electrically connected to the first contact electrodes and the common electrode.

The common electrode may be electrically connected to a first power line of the circuit substrate through a second contact electrode corresponding thereto, and the cathodes of the light emitting elements may be connected to a first electrode of a driving transistor of the circuit substrate through first and second contact electrodes corresponding thereto.

Second electrodes of driving transistors of the circuit substrate may be commonly and electrically connected to a second power line.

A voltage applied to the first power line may be greater than a voltage applied to the second power line during a light emitting period of the light emitting elements.

The display device may further include a connection electrode electrically connecting the anodes of the light emitting elements and the common electrode; and a first insulation layer overlapping the connection electrode.

The display device may further include color conversion elements disposed on the first insulation layer and overlapping the light emitting elements; and color filters overlapping the color conversion elements.

The display device may further include a bank surrounding side surfaces of the color conversion elements; a light block layer overlapping the bank, the light block layer including openings exposing the color filters; and a second insulation layer overlapping the light block layer and the color filters.

The display device may further include a first metal layer disposed on the first insulation layer; a second metal layer disposed on the first metal layer; and a carrier substrate disposed on the second metal layer, wherein the first metal layer, the second metal layer, and the carrier substrate may include holes and the color conversion elements may be disposed in the holes.

The color filters may overlap the color conversion elements on the carrier substrate.

An embodiment provides a manufacturing method of a display device, that may include forming a first semiconductor layer, an active layer, a second semiconductor layer, a connection electrode, a first insulation layer, and a first metal layer on a base substrate in sequence; forming a second metal layer on a carrier substrate; bonding the first metal layer and the second metal layer; and separating the base substrate and etching the first semiconductor layer, the active layer, and the second semiconductor layer to form light emitting elements, wherein the first semiconductor layer may include an N-type dopant, and the second semiconductor layer may include a P-type dopant.

The manufacturing method may further include forming a common electrode on the connection electrode; and forming first contact electrodes on the first semiconductor layer of the light emitting elements.

The manufacturing method may further include bonding the common electrode and the first contact electrodes to second contact electrodes of a circuit substrate; and separating the first metal layer from the first insulation layer.

The manufacturing method may further include forming color filters on a second insulation layer; and forming a light block layer exposing the color filters on the second insulation layer.

The manufacturing method may further include forming a bank on the light block layer, the bank including holes exposing the color filters and disposing color conversion elements in the holes of the bank.

The manufacturing method may further include bonding the bank onto the first insulation layer.

The manufacturing method may further include forming a passivation film overlapping the light emitting elements; and forming an opening at the passivation film exposing the first semiconductor layer of the light emitting elements.

The manufacturing method may further include forming a first planarization layer overlapping the passivation film and the connection electrode; and etching the first planarization layer to expose a portion of the connection electrode and the first semiconductor layer of the light emitting elements.

The manufacturing method may further include forming a third metal layer on the first planarization layer and the first semiconductor layer; and polishing the third metal layer to form a common electrode and first contact electrodes.

The manufacturing method may further include bonding second contact electrodes on the circuit substrate to the common electrode and the first contact electrodes.

The manufacturing method may further include etching the carrier substrate, the second metal layer, and the first metal layer to form holes; disposing color conversion elements in the holes of the carrier substrate, the second meal layer, and the first metal layer; and forming color filters to overlap the color conversion elements and the carrier substrate.

According to the display device and the manufacturing method thereof according to the disclosure, it is possible to provide a high resolution display device that may reduce current consumption and a load.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
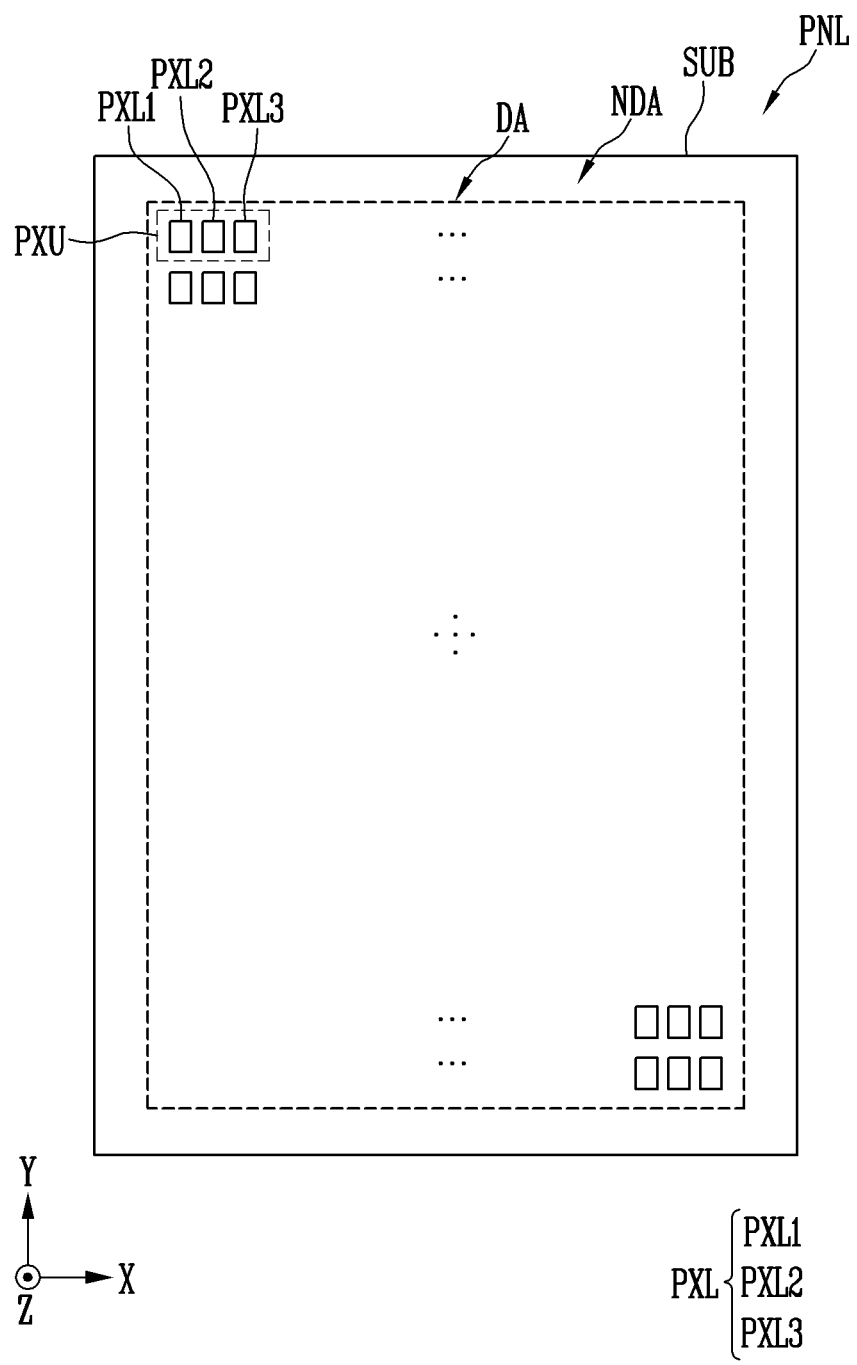
FIG. 1 is a schematic plan view of a display device according to an embodiment.

The disclosure will be described more fully hereinafter with reference to the accompanying drawings, in which embodiments are shown. As those skilled in the art would appreciate, the described embodiments may be modified in various different ways, all without departing from the spirit or scope of the disclosure.

In order to clearly describe the disclosure, parts that may be irrelevant to the description are omitted, and identical or similar constituent elements throughout the specification are denoted by the same reference numerals. Therefore, the above-mentioned reference numerals may be used in other drawings.

Further, in the drawings, the size and thickness of each element are arbitrarily illustrated for ease of description, and the disclosure is not necessarily limited to those illustrated in the drawings. In the drawings, the thicknesses of layers, films, panels, regions, etc. may be exaggerated for clarity.

In addition, the expression "equal to or the same as" in the description may mean "substantially equal to or the same as". For example, it may be the same as understood by one of ordinary skill in the art to be the same. Furthermore, other expressions or descriptions may be expressions or descriptions including "substantially" even though "substantially" may not be expressly included in those expressions or descriptions.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a schematic plan view of a display device according to an embodiment.

FIG. 1 illustrates a display panel PNL provided in a display device, for example, a display device, as an example of an electronic device that may use a light emitting element as a light source. A first direction X and a second direction Y may be planar directions defining a plane. The first direction X and the second direction Y may be orthogonal to each other. A third direction Z may be a vertical direction (height direction). The third direction Z may be orthogonal to the first and second directions X and Y.

For better understanding and ease of description, FIG. 1 briefly illustrates a structure of the display panel PNL based on a display area DA. However, in an embodiment, at least one driving circuit portion (for example, at least one of a scan driver and a data driver), wires, and/or pads, which are not shown, may be further disposed in the display panel PNL.

Referring to FIG. 1, the display panel PNL may include a substrate SUB and pixels or pixel units PXU disposed on the substrate SUB. For example, one pixel unit PXU may include a first pixel PXL1, a second pixel PXL2, and a third pixel PXL3. Hereinafter, in case that arbitrarily referring to at least one of the first pixel PXL1, the second pixel PXL2, and the third pixels PXL, or in case that comprehensively referring to two or more thereof, they will be referred to as a "pixel PXL" or "pixels PXL".

The substrate SUB may form a base member of the display panel PNL, and may be a rigid or flexible substrate or film. For example, the substrate SUB may be formed as a rigid substrate made of glass or tempered glass and as a flexible substrate made of a plastic or metallic material (or a thin film), but the material and/or physical properties of the substrate SUB are not particularly limited. A circuit substrate CSUB to be described later may include the substrate SUB and circuit elements formed on the substrate SUB (see FIG. 3 and FIG. 14).

The display panel PNL and the substrate SUB for forming the display panel include a display area DA for displaying an image and a non-display area NDA excluding the display area DA. The pixels PXL may be disposed in the display area DA. In the non-display area NDA, various wires connected to the pixels PXL of the display area DA, pads, and/or internal circuit parts may be disposed. The pixels PXL may be regularly arranged or disposed according to a stripe or PENTILE™ arrangement structure. However, the arrangement structure of the pixels PXL is not limited thereto, and the pixels PXL may be arranged or disposed in the display area DA in various structures and/or methods.

In an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged or disposed. At least one first to third pixels PXL1, PXL2, and PXL3 disposed to be adjacent to each other may form one pixel unit PXU that may emit light of various colors. For example, each of the first to third pixels PXL1, PXL2, and PXL3 may be a sub-pixel that emits light of a color. In an embodiment, the first pixel PXL1 may be a pixel of the first color emitting light of the first color (for example, red), the second pixel PXL2 may be a pixel of the second color emitting light of the second color (for example, green), and the third pixel PXL3 may be a pixel of the third color emitting light of the third color (for example, blue), but the disclosure is not necessarily limited thereto.

In the embodiment, the first pixel PXL1, the second pixel PXL2, and the third pixel PXL3 are provided with light emitting elements that emit light of a same color, and include color filters and/or color conversion elements of different colors disposed on respective light emitting elements, so that they may emit light of the first color, the second color, and the third color, respectively. In an embodiment, the first pixel PXL1, the second pixel PXL2, and the third pixel PXL3 are each provided with a first color light emitting element, a second color light emitting element, and a third color light emitting element as a light source, respectively, so that they respectively emit light of the first color, second color, and third color. However, the color, type, and/or number of pixels PXL forming each pixel unit PXU are not particularly limited. For example, the color of light emitted by each pixel PXL may be variously changed.

The pixel PXL may include at least one light source driven by a control signal (for example, a scan signal and a data signal) and/or a power source (for example, a first power source and a second power source). In the embodiment, the light source may include ultra-small columnar light emitting elements having a size as small as a nanometer scale to a micrometer scale. However, the disclosure is not limited thereto, and various types of light emitting elements may be used as the light source of the pixel PXL.

Figure 2:
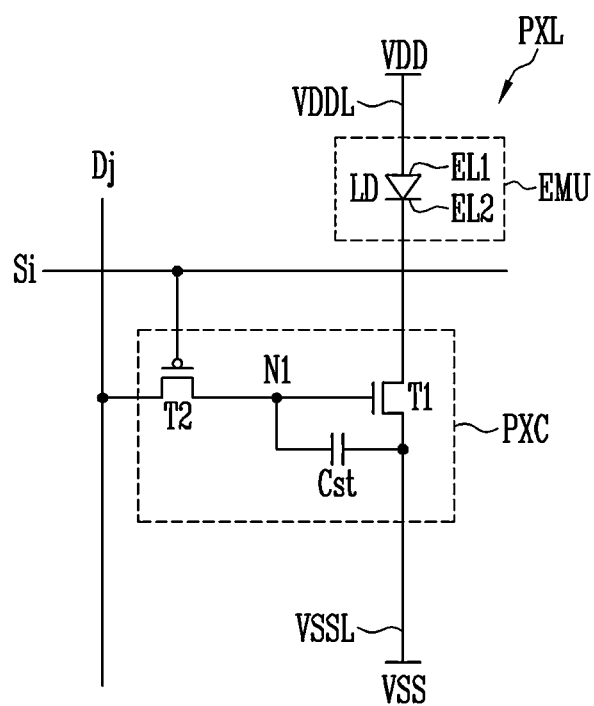
FIG. 2 is a schematic diagram of an equivalent circuit of a pixel according to an embodiment.

FIG. 2 illustrates a schematic diagram of an equivalent circuit of a pixel according to an embodiment.

FIG. 2 illustrates an electrical connection relationship of constituent elements included in the pixel PXL. However, types of the constituent elements included in the pixel PXL are not necessarily limited thereto.

In an embodiment, the pixel PXL shown in FIG. 2 may be one of the first pixel PXL1, the second pixel PXL2, and the third pixel PXL3 provided in the display panel PNL of FIG.

1. The first pixel PXL1, the second pixel PXL2, and the third pixel PXL3 may have substantially a same or similar structure.

Referring to FIG. 2, each pixel PXL may include a light emitting unit EMU that generates luminance light corresponding to a data signal. The pixel PXL may further include a pixel circuit PXC for driving the light emitting unit EMU.

In an embodiment, the light emitting unit EMU may include at least one light emitting element LD electrically connected between a first power line VDDL to which a voltage of a first power source VDD is applied and a second power line VSSL to which a voltage of a second power source VSS is applied. For example, the light emitting element LD may include a first terminal EL1 connected to the first power line VDDL and a second terminal EL2 connected to a first electrode of a first transistor T1. In the embodiment, the first terminal EL1 may be an anode, and the second terminal EL2 may be a cathode.

During a light emitting period of the light emitting element LD, a voltage applied to the first power line VDDL may be greater than that applied to the second power line VSSL. For example, a potential difference between the first power source VDD and the second power source VSS may be set to be greater than or equal to a threshold voltage of the light emitting element LD during a light emitting period of the pixel PXL.

The light emitting element LD may form an effective light source of the light emitting unit EMU. The light emitting element LD may emit light with luminance corresponding to a driving current controlled by the pixel circuit PXC. For example, during each frame period, the pixel circuit PXC may control a driving current corresponding to a gray value of corresponding frame data to flow to the light emitting unit EMU. Accordingly, while the light emitting element LD emits light with a luminance corresponding to the driving current, the light emitting unit EMU may emit light.

The pixel circuit PXC may be connected to a scan line Si and a data line Dj of the pixel PXL. For example, in case that the pixel PXL is disposed in an i-th (i is a natural number) row and a j-th (j is a natural number) column of the display area DA, the pixel circuit PXC of the pixel PXL may be connected to an i-th scan line Si and a j-th data line Dj of the display area DA. In an embodiment, the pixel circuit PXC may include first and second transistors T1 and T2 and a storage capacitor Cst. However, the structure of the pixel circuit PXC is not limited to the embodiment shown in FIG. 2.

The pixel circuit PXC may include the first and second transistors T1 and T2 and the storage capacitor Cst.

A first electrode of the first transistor T1 may be connected to the light emitting unit EMU, and a second electrode thereof may be connected to the second power line VSSL. A gate electrode of the first transistor T1 may be connected or coupled to a first node N1. The first transistor T1 is a driving transistor, and controls an amount of driving current supplied to the light emitting element LD in response to a voltage difference between the first node N1 and the second electrode. For example, the first transistor may be an N-type transistor (for example, NMOS). The second electrodes of first transistors T1 of pixels PXL may be commonly connected to the second power line VSSL.

A first electrode of the second transistor T2 (switching transistor) may be connected to the j-th data line Dj, and a second electrode thereof may be connected to the first node N1. A gate electrode of the second transistor T2 may be connected to the i-th scan line Si. For example, the second transistor may be a P-type transistor (for example, PMOS).

The second transistor T2 may be turned on in case that a scan signal of a voltage capable of turning on the second transistor T2 is supplied from the i-th scan line Si to electrically connect the j-th data line Dj and the first node N1. A data signal of a corresponding frame is supplied to the j-th data line Dj, and accordingly, the data signal may be transmitted to the first node N1. The data signal transmitted to the first node N1 may be charged in the storage capacitor Cst.

The storage capacitor Cst may charge a voltage corresponding to the data signal supplied to the first node N1, and may maintain the charged voltage until a data signal of a next frame is supplied.

FIG. 2 illustrates the pixel circuit PXC that may include the second transistor T2 for transmitting the data signal to the inside of the pixel PXL, the storage capacitor Cst for storing the data signal, and the first transistor T1 for transmitting the driving current corresponding to the data signal to the light emitting element LD, but the disclosure is not necessarily limited thereto, and the structure of the pixel circuit PXC may be variously changed. For example, the pixel circuit PXC may additionally include at least one transistor such as a transistor for compensating the threshold voltage of the first transistor T1, a transistor for initializing the first node N1, and/or a transistor for controlling a light emission time of the light emitting elements LD, or other circuit elements such as a boosting capacitor for boosting the voltage of the first node N1.

Figure 3:
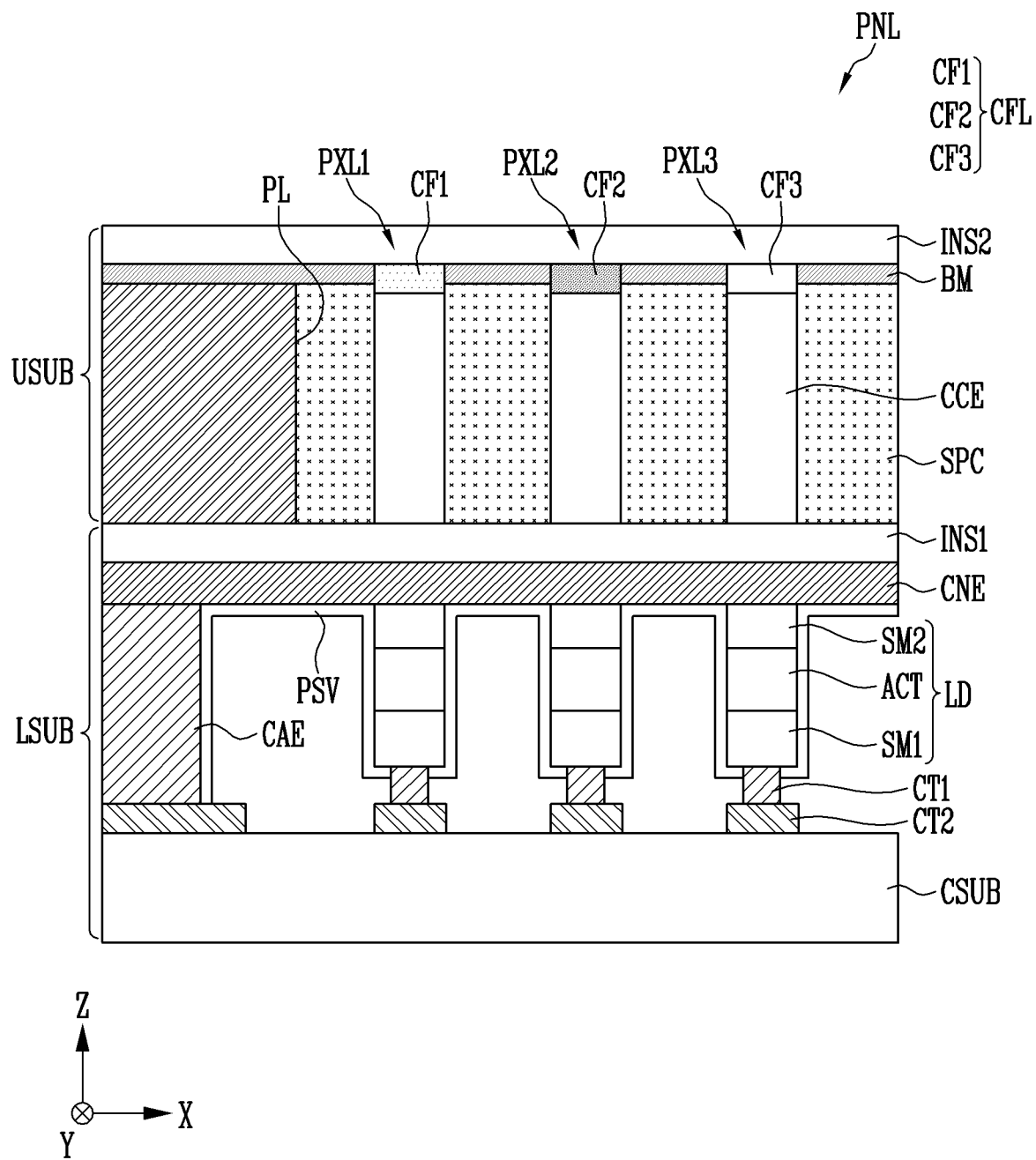
FIG. 3 is a schematic cross-sectional view of a structure of a display device according to an embodiment.

FIG. 3 is a schematic cross-sectional view of a structure of a display device according to an embodiment.

Referring to FIG. 3, a schematic cross-sectional view of an area in which an arbitrary first pixel PXL1, an arbitrary second pixel PXL2, and an arbitrary third pixel PXL3 are disposed among the display panel PNL of the display device is illustrated as an example. In FIG. 3 and the drawings therebelow, reference numerals common to respective pixels PXL1, PXL2, and PXL3 are not repeatedly denoted.

The circuit substrate CSUB may include the substrate SUB and the circuit elements formed on the substrate SUB as described above (see FIG. 1). For example, the circuit elements formed on the substrate SUB may include the pixel circuit PXC (see FIG. 2).

Second contact electrodes CT2 may be disposed on the circuit substrate CSUB, and may be respectively connected to first contact electrodes CT1 and a common electrode CAE. The first contact electrodes CT1 may be disposed on the corresponding second contact electrodes CT2. The first contact electrodes CT1 may be respectively connected to cathodes SM1 of the light emitting elements LD. The common electrode CAE may be disposed on the corresponding second contact electrode CT2.

The first and second contact electrodes CT1 and CT2 and the common electrode CAE may each include metal or a metal oxide. For example, the first and second contact electrodes CT1 and CT2 and the common electrode CAE are respectively copper (Cu), gold (Au), chromium (Cr), titanium (Ti), aluminum (Al), nickel (Ni), an indium tin oxide (ITO), an oxide or alloy thereof, and the like within the spirit and the scope of the disclosure. In the embodiment, the first and second contact electrodes CT1 and CT2 and the common electrode CAE may be made of the same material or a similar material. The first contact electrodes CT1 and the second contact electrodes CT2 may be readily bonded. The common electrode CAE and the second contact electrode CT2 may be readily bonded. However, the disclosure is not necessarily limited thereto, and materials included in the first and second contact electrodes CT1 and CT2 and the common electrode CAE may be variously changed.

The common electrode CAE may be connected to the first power line VDDL of the circuit substrate CSUB through the corresponding second contact electrode CT2 (see FIG. 2). The cathodes SM1 may be connected to the first electrode of the driving transistor (first transistor T1) of the circuit substrate CSUB through the corresponding first and second contact electrodes CT1 and CT2 (see FIG. 2).

The light emitting elements LD may have a structure in which the cathode SM1, an active layer ACT, and an anode SM2 may be sequentially stacked each other or grown. The cathodes SM1 may be disposed on the corresponding first contact electrode CT1. The anodes SM2 may contact a connection electrode CNE. The anodes SM2 may be commonly connected to the common electrode CAE through the connection electrode CNE. The anodes SM2, the connection electrode CNE, and the common electrode CAE may be electrically the same node. The active layer ACT may be disposed between the cathode SM1 and the anode SM2.

Each of the light emitting elements LD may be provided in various shapes. As an example, the light emitting elements LD may have a long (for example, an aspect ratio greater than 1) rod-like shape or bar-like shape in the third direction Z, but the disclosure is not limited thereto. For example, each of the light emitting elements LD may have a pillar shape in which a diameter of one end portion or an end portion thereof and a diameter of the other end portion or another end portion thereof are different from each other. The light emitting elements LD may be ultra-small light emitting diodes (LED) manufactured to have a diameter and/or a length of a nanometer scale to a micrometer scale. However, the disclosure is not necessarily limited thereto, and the size of the light emitting element LD may be variously changed to meet a required condition (or design condition) of a lighting device or a display device to which the light emitting element LD is applied.

The cathode SM1 may be made of a first semiconductor. For example, the cathode SM1 may be formed by etching a first semiconductor layer SM1L (see FIG. 5). In the embodiment, the first semiconductor may include at least one N-type semiconductor. For example, the first semiconductor may include a semiconductor material of one of GaN, InAlGaN, AlGaN, InGaN, AlN, and InN, and may be an N-type semiconductor doped with a first conductive dopant (or n-type dopant) such as Si, Ge, Sn, or the like within the spirit and the scope of the disclosure. For example, the first semiconductor layer may include a GaN semiconductor material doped with a dopant of first conductivity (or an N-type dopant). However, the material included in the first semiconductor is not limited thereto, and the first semiconductor may include various other materials.

The active layer ACT may have a single or multiple quantum well structure. For example, in case that the active layer ACT is formed of a multi-quantum well structure, the active layer ACT may have a structure in which a barrier layer (not shown), a strain reinforcing layer (not shown), and a well layer (not shown), which may consist of one unit, may be periodically and repeatedly stacked each other. Since the strain reinforcing layer has a smaller lattice constant than that of the barrier layer, it may further reinforce strain applied to the well layer, for example, compressive strain. However, the structure of the active layer ACT is not limited to the above-described embodiment.

The active layer ACT may emit light having a wavelength of 400 nm to 900 nm, and may have a double heterostructure. In the embodiment, a clad layer (not shown) doped with a dopant of conductivity may be formed on an upper and/or lower portion of the active layer ACT. For example, the cladding layer may be formed of AlGaN or InAlGaN. In an embodiment, a material such as AlGaN and InAlGaN may be used to form the active layer ACT, and in addition, various materials may form the active layer ACT In case that a signal (or voltage) is applied to each end portion of the light emitting elements LD, while electron-hole pairs are combined in the active layer ACT, and each light emitting element LD emits light. By controlling the light emission of each light emitting element LD by using this principle, each light emitting element LD may be used as a light source (or light emitting source) for various light emitting devices in addition to the pixel PXL of the display device.

The anode SM2 may be made of a second semiconductor. For example, the anode SM2 may be formed by etching a second semiconductor layer SM2L (see FIG. 6 and FIG. 7). The second semiconductor may include a semiconductor of a different type from that of the first semiconductor. The second semiconductor may include, for example, at least one P-type semiconductor layer. For example, the second semiconductor may include at least one semiconductor material of GaN, InAlGaN, AlGaN, InGaN, AlN, and InN, and may include a P-type semiconductor doped with a second conductive dopant (or p-type dopant) such as Mg, Zn, Ca, Sr, and Ba. For example, the second semiconductor may include a GaN semiconductor material doped with a dopant of second conductivity (or a P-type dopant), but is not limited thereto, and various materials may form the second semiconductor.

In an embodiment, each of the light emitting elements LD may further include an additional layer or an additional electrode (not shown) disposed at one end portion or an end portion or the other end portion or another end portion in addition to the above-described cathode SM1, active layer ACT, and anode SM2. The additional electrode may be an ohmic contact electrode, but is not limited thereto. In an embodiment, the additional electrode may be a schottky contact electrode. The additional electrode may include a conductive material. For example, the additional electrode may include a transparent conductive oxide such as an indium tin oxide (ITO), an indium zinc oxide (IZO), a zinc oxide (ZnO), an indium gallium zinc oxide (IGZO), and an indium tin zinc oxide (ITZO), but is not limited thereto.

In an embodiment, the light emitting elements LD may further include a passivation film PSV formed on surfaces of the cathode SM1, the active layer ACT, and the anode SM2. The passivation film PSV is an insulating film, and may prevent an electrical short circuit that may occur in case that the active layer ACT contacts conductive materials other than the cathode SM1 and the anode SM2. The passivation film PSV may minimize surface defects of each light emitting element LD to improve lifespan and luminous efficiency of each light emitting element LD. In case that the light emitting elements LD are closely disposed, the passivation film PSV may prevent unwanted short circuits that may occur between the light emitting elements LD. For example, the passivation film PSV may be a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide (TiOx), and various types of inorganic materials.

The connection electrode CNE may connect the anodes SM2 and the common electrode CAE. For example, the connection electrode CNE may cover or overlap the common electrode CAE, the passivation film PSV, and the anodes SM2. The connection electrode CNE may be a transparent electrode. For example, the connection electrode may include a transparent conductive oxide such as an indium tin oxide (ITO), an indium zinc oxide (IZO), a zinc oxide (ZnO), an indium gallium zinc oxide (IGZO), and an indium tin zinc oxide (ITZO), but is not limited thereto.

A first insulation layer INS1 may cover or overlap the connection electrode CNE. The first insulation layer INS1 may be made of an inorganic material. For example, the first insulation layer INS1 may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials. However, the disclosure is not necessarily limited thereto, and the first insulation layer INS1 may be made of an organic material. For example, the first insulation layer INS1 may include an organic material such as an acrylates resin, an epoxy resin, a phenolic resin, a polyamides resin, a polyimides resin, a polyesters resin, a polyphenylenesulfides resin, or a benzocyclobutene (BCB).

Color conversion elements CCE may be disposed on the first insulation layer INS1 to overlap the light emitting elements LD. The color conversion elements CCE may overlap the corresponding light emitting elements LD in the third direction Z. In the embodiment, the color conversion elements CCE may be injected into a hole of a partition wall or a bank SPC by capillary action. A high resolution display device may be realized beyond a limit of a photo process or inkjet process.

The color conversion elements CCE may include quantum dots that convert light emitted from the light emitting elements LD of each pixel PXL into light of a color. For example, the color conversion elements CCE may include quantum dots dispersed in a matrix material such as a base resin.

In the embodiment, the first to third pixels PXL1, PXL2, and PXL3 may include the light emitting elements LD that emit light of a same color. For example, the first to third pixels PXL1, PXL2, and PXL3 may include the light emitting elements LD that emit light of a third color (or blue color). The color conversion elements CCE may include quantum dots that convert blue light emitted from the light emitting element LD into white light. An absorption coefficient of the quantum dot may be increased by irradiating blue light having a relatively short wavelength in the visible light region to the quantum dots. Accordingly, light efficiency finally emitted from the pixels PXL may be improved, and simultaneously, excellent color reproducibility may be secured. The light emitting unit EMU of the first to third pixels PXL1, PXL2, and PXL3 may be formed by using the light emitting elements LD of a same color (for example, the blue color light emitting element), thereby increasing the manufacturing efficiency of the display device.

However, the disclosure is not necessarily limited thereto, the first to third pixels PXL1, PXL2, and PXL3 may include light emitting elements LD that emit light of different colors. For example, the first pixel PXL1 may include a first color (or red color) light emitting element LD, the second pixel PXL2 may include a second color (or green color) light emitting element LD, and the third pixel PXL3 may include a third color (or blue color) light emitting element LD.

Color filters CFL may cover or overlap the color conversion elements CCE. A full-color image may be displayed by disposing color filters CF1, CF2, and CF3 matching respective colors of the first to third pixels PXL1, PXL2, and PXL3. The first color filter CF1 may be disposed on the color conversion element CCE corresponding to the first pixel PXL1 to selectively transmit light emitted from the first pixel PXL1. The second color filter CF2 may be disposed on the color conversion element CCE corresponding to the second pixel PXL2 to selectively transmit light emitted from the second pixel PXL2. The third color filter CF3 may be disposed on the color conversion element CCE corresponding to the third pixel PXL3 to selectively transmit light emitted from the third pixel PXL3.

In the embodiment, the first color filter CF1, the second color filter CF2, and the third color filter CF3 may be a red color filter, a green color filter, and a blue color filter respectively, but the disclosure is not limited necessarily thereto.

The first color filter CF1 may overlap the light emitting element LD and color conversion element CCE of the first pixel PXL1 in the third direction Z. The first color filter CF1 may include a color filter material that selectively transmits light of a first color (or red color). For example, in case that the first pixel PXL1 is a red pixel, the first color filter CF1 may include a red color filter material.

The second color filter CF2 may overlap the light emitting element LD and color conversion element CCE of the second pixel PXL2 in the third direction Z. The second color filter CF2 may include a color filter material that selectively transmits light of a second color (or green color). For example, in case that the second pixel PXL2 is a green pixel, the second color filter CF2 may include a green color filter material.

The third color filter CF3 may overlap the light emitting element LD and color conversion element CCE of the third pixel PXL3 in the third direction Z. The third color filter CF3 may include a color filter material that selectively transmits light of a third color (or blue color). For example, in case that the third pixel PXL3 is a blue pixel, the third color filter CF3 may include a blue color filter material.

The partition wall SPC may surround side surfaces of the color conversion elements CCE. The partition wall SPC may have holes corresponding to respective color conversion elements CCE. The partition wall SPC may be disposed on the first insulation layer INS1. The partition wall SPC (or bank) may be made of the aforementioned inorganic materials or organic materials. The partition wall SPC may perform a function of minimizing color mixing between the pixels PXL1, PXL2, and PXL3. The partition wall SPC may be manufactured through a photolithography process. The partition wall SPC may be a photo resist. The photo resist refers to a material that may selectively remove lighted and non-lighted areas during a subsequent development process by using a property of changing solubility in a developer by receiving light of a wavelength. As the photo resist, a polymer compound may be used, but is not limited thereto. As in an embodiment, the partition wall SPC may be made of a ceramic material instead of the polymer compound. A wet or dry etching process may be added to the photolithography process.

A planarization layer PL may be disposed on the first insulation layer INS1. The planarization layer PL may fill a space on the first insulation layer INS1 except for the partition wall SPC and the color conversion elements CCE. For example, the planarization layer PL may be made of an organic material. For example, the planarization layer PL may include an organic material such as an acrylates resin, an epoxy resin, a phenolic resin, a polyamides resin, a polyimides resin, a polyesters resin, a polyphenylenesulfides resin, or a benzocyclobutene (BCB). However, it is not necessarily limited thereto, and the planarization layer PL may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

A light block layer BM may have openings that cover or overlap the partition wall SPC but expose the color filters CFL. The light block layer BM may cover or overlap the planarization layer PL. The light block layer BM may be a black matrix. The light block layer BM may be made of at least a light blocking material, or may be made of a color filter material of a color.

A second insulation layer INS2 may cover or overlap the light block layer BM and the color filters CFL. The second insulation layer INS2 may be made of any of the inorganic materials described above. In an embodiment, the second insulation layer INS2 may be made of any of the organic materials described above.

In the display device according to an embodiment, as the anodes SM2 of the light emitting elements LD are commonly connected to the common electrode CAE, the connection relationship between the light emitting unit EMU and the pixel circuit PXC as shown in FIG. 2 may be formed. Since a sink current of the pixel circuit PXC is used for light emitting of the light emitting unit EMU, an internal current of the pixel circuit PXC is not used, thereby reducing current consumption and a load.

In the embodiment of FIG. 3, the display panel PNL may be formed by attaching an upper substrate USUB and a lower substrate LSUB to each other. For example, the lower substrate LSUB may include the circuit substrate CSUB to the first insulation layer INS1, and the upper substrate USUB may include the partition wall SPC and the planarization layer PL to the second insulation layer INS2.

FIG. 4 to FIG. 13 are schematic cross-sectional views of a manufacturing method of the display device of FIG. 3. FIG. 4 to FIG. 8 illustrate a manufacturing method of the lower substrate LSUB, and FIG. 9 to FIG. 13 illustrate a manufacturing method of the upper substrate USUB.

Figure 4:
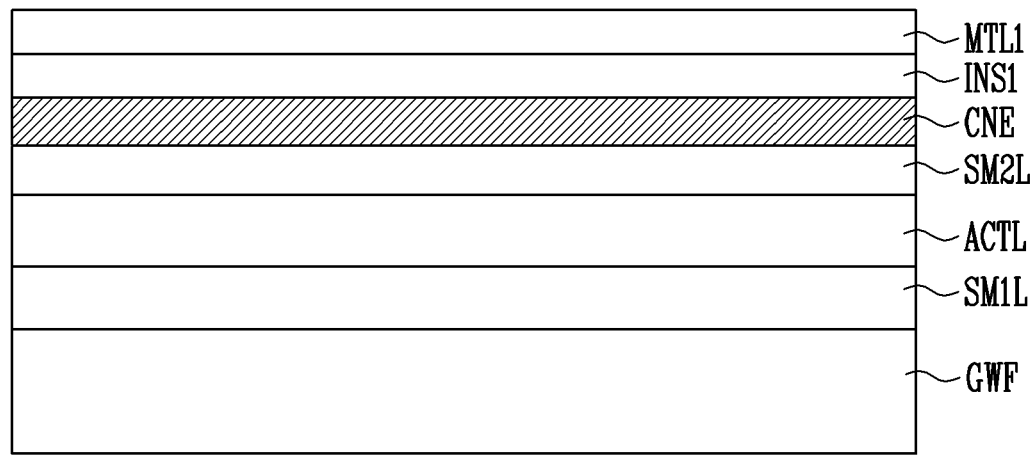
FIG. 4 to FIG. 13 are schematic cross-sectional views of a manufacturing method of the display device of FIG. 3.
Figure 4:
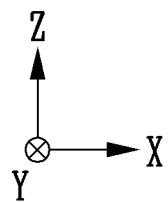

Referring to FIG. 4, a first semiconductor layer SM1L, an active layer ACTL, a second semiconductor layer SM2L, a connection electrode CNE, a first insulation layer INS1, and a first metal layer MTL1 may be sequentially formed on a base substrate GWF.

The base substrate GWF may be a silicon wafer. On the other hand, the base substrate GWF may be made of a light-transmitting material, for example, at least one of sapphire ($AL_2O_3$), a single crystal substrate, SiC, GaAs, GaN, ZnO, AlN, Si, GaP, InP, and Ge.

The first semiconductor layer SM1L, the active layer ACTL, and the second semiconductor layer SM2L may be referred to as a light emitting laminate. The light emitting laminate may be formed by growing seed crystals by an epitaxial method. In an embodiment, the light emitting laminate may be formed by a metal organic chemical vapor deposition (MOCVD). However, the disclosure is not necessarily limited thereto, and the light emitting laminate may be formed by various methods such as an electron beam deposition, a physical vapor deposition (PVD), a chemical vapor deposition (CVD), a plasma laser deposition (PLD), a dual-type thermal evaporation, and a sputtering method.

Referring to FIG. 3, as described above, the first semiconductor layer SM1L may be an N-type semiconductor doped with an N-type dopant, and the second semiconductor layer SM2L may be a P-type semiconductor doped with a P-type dopant. A duplicate description of the constituent materials of the light emitting laminate will be omitted.

Figure 5:
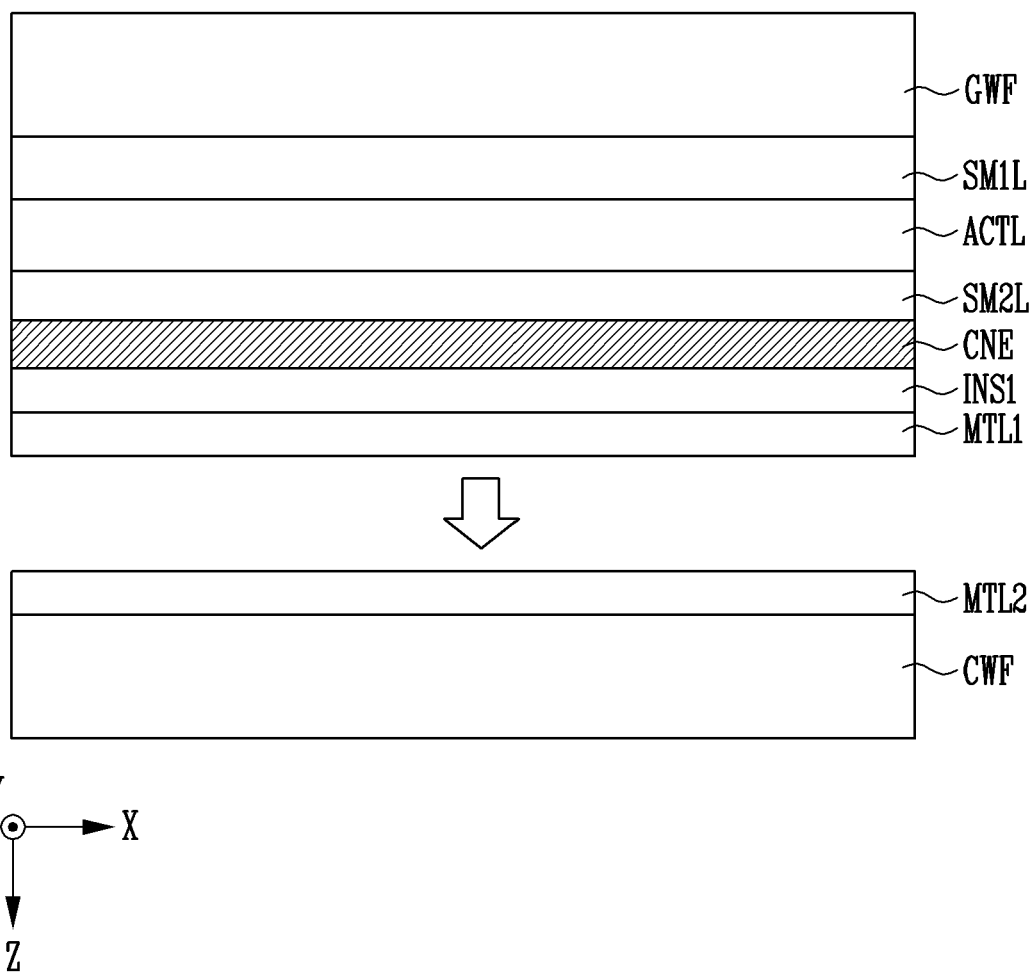

Referring to FIG. 5, a second metal layer MTL2 may be formed on a carrier substrate CWF. The carrier substrate CWF may be a silicon wafer. On the other hand, the carrier substrate CWF may be made of a light-transmitting material, for example, at least one of sapphire ($AL_2O_3$), a single crystal substrate, SiC, GaAs, GaN, ZnO, AlN, Si, GaP, InP, and Ge.

After flipping the base substrate GWF, the first metal layer MTL1 and the second metal layer MTL2 may be bonded. The bonding may be a wafer-to-wafer (W2W) bonding. In case that the first metal layer MTL1 and the second metal layer MTL2 are made of the same material or a similar material, the first metal layer MTL1 and the second metal layer MTL2 after bonding may be expressed as one layer or a layer.

Each of the first metal layer MTL1 and the second metal layer MTL2 may be made of metal or a metal oxide. For example, each of the first metal layer MTL1 and the second metal layer MTL2 may be made of copper (Cu), gold (Au), chromium (Cr), titanium (Ti), aluminum (Al), nickel (Ni), an indium tin oxide (ITO), and an oxides or alloy thereof. In the embodiment, the first metal layer MTL1 and the second metal layer MTL2 may be made of the same material or a similar material. The first metal layer MTL1 and the second metal layer MTL2 may be readily bonded to each other, but the disclosure is not limited thereto. Materials included in the first metal layer MTL1 and the second metal layer MTL2 may be variously changed.

Figure 6:
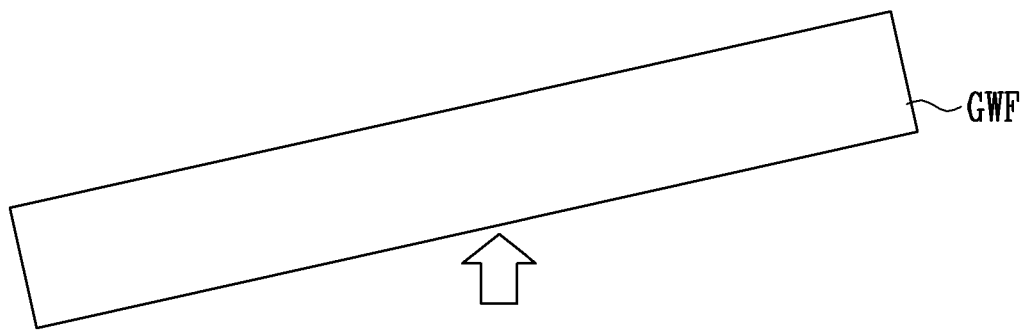
Figure 6:
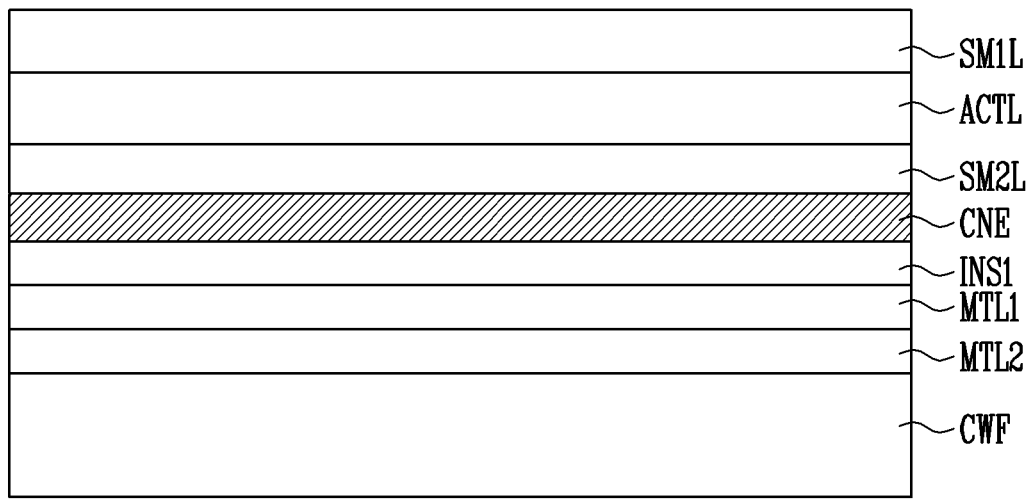
Figure 6:
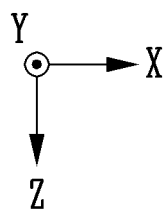

Referring to FIG. 6, after the bonding is finished, the base substrate GWF may be separated. For example, the base substrate GWF may be separated by using a laser lift off (LLO), chemical lift off (CLO), electrical lift off (ELO), or etching method. In an embodiment, at least portion of the base substrate GWF may be removed by grinding it flat.

Figure 7:
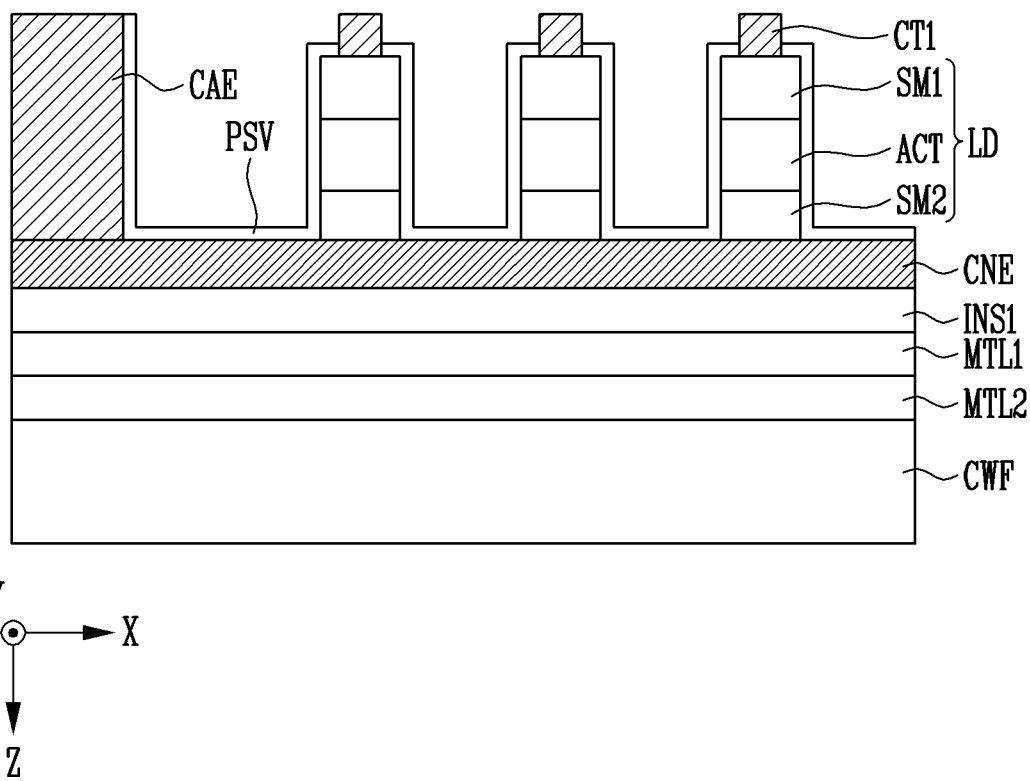

Referring to FIG. 7, the light emitting elements LD may be formed by etching the first semiconductor layer SM1L, the active layer ACTL, and the second semiconductor layer SM2L. As described above with reference to FIG. 3, each of the light emitting elements LD may include the cathode SM1, the active layer ACT, and the anode SM2. The light emitting elements LD may be formed at positions corresponding to the first to third pixels PXL1, PXL2, and PXL3, respectively. The etching process of the light emitting laminate may include a dry etching method, a wet etching method, a reactive ion etching (ME) method, and an inductively coupled plasma reactive ion etching (ICP-RIE) method.

The common electrode CAE and the first contact electrodes CT1 may be formed. For example, the common electrode CAE may be formed on the connection electrode CNE, and the first contact electrodes CT1 may be formed on the first semiconductor layer SM1L of the light emitting elements LD, for example, the cathode SM1. For example, the common electrode CAE and the first contact electrodes CT1 may be simultaneously formed in the same process. For example, a metal layer may be formed on the light emitting elements LD and the connection electrode CNE, and the common electrode CAE and the first contact electrodes CT1 may be simultaneously formed by etching the metal layer. For example, a metal layer may be formed by depositing a copper (Cu) seed and performing copper plating, and the common electrode CAE and the first contact electrodes CT1 may be formed by etching them. The common electrode CAE and the first contact electrodes CT1 may be made of the same material or a similar material.

The passivation film PSV may be formed. Upper end portions of the common electrode CAE and the first contact electrodes CT1 may be exposed by etching the passivation film PSV.

In an embodiment, the passivation film PSV may be first formed, and the common electrode CAE and the first contact electrodes CT1 may be formed. The passivation film PSV may be formed and etched to expose the first semiconductor layer SM1L of the light emitting elements LD, for example, the cathode SM1. The common electrode CAE and the first contact electrodes CT1 may be formed. Unlike that shown in FIG. 7, the common electrode CAE of the first direction X will not be covered or overlapped by the passivation film PSV. The above description may also be applied to the structure of FIG. 3.

Figure 15:
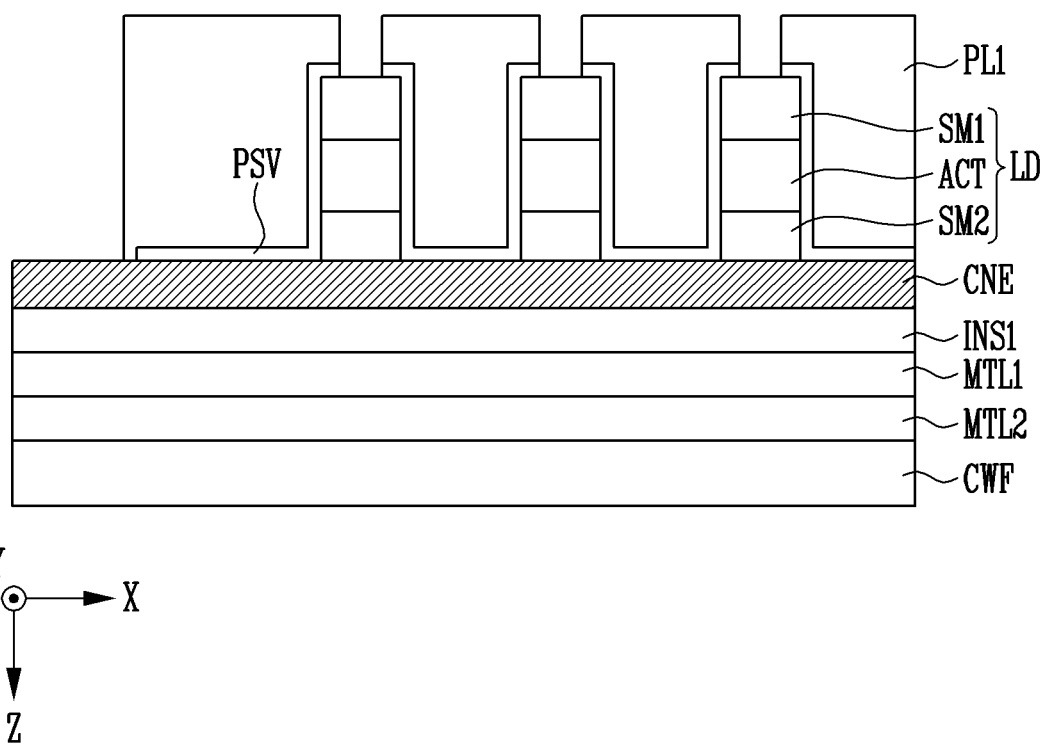
FIG. 15 to FIG. 19 are schematic cross-sectional views of a manufacturing method of the display device of FIG. 14.
Figure 16:
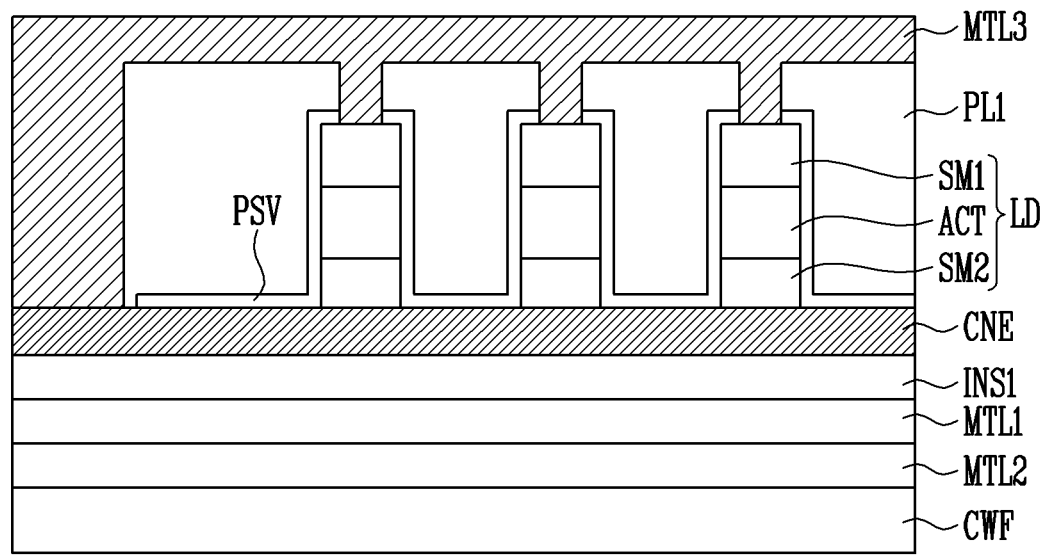
Figure 17:
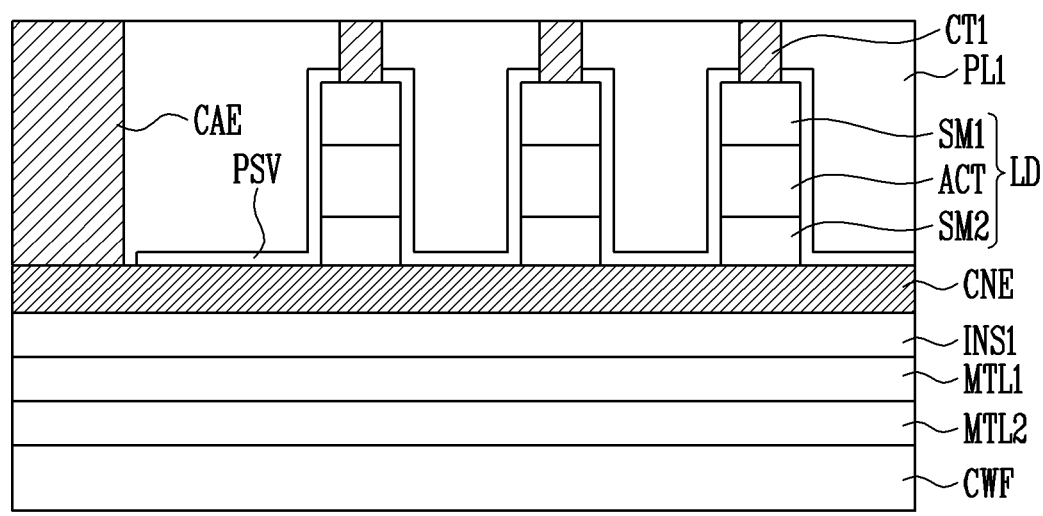

In an embodiment, the manufacturing steps of FIG. 7 may be replaced with manufacturing steps of FIG. 15 to FIG. 17. After the step of FIG. 17, the first planarization layer PL1 may be maintained or removed.

Figure 8:
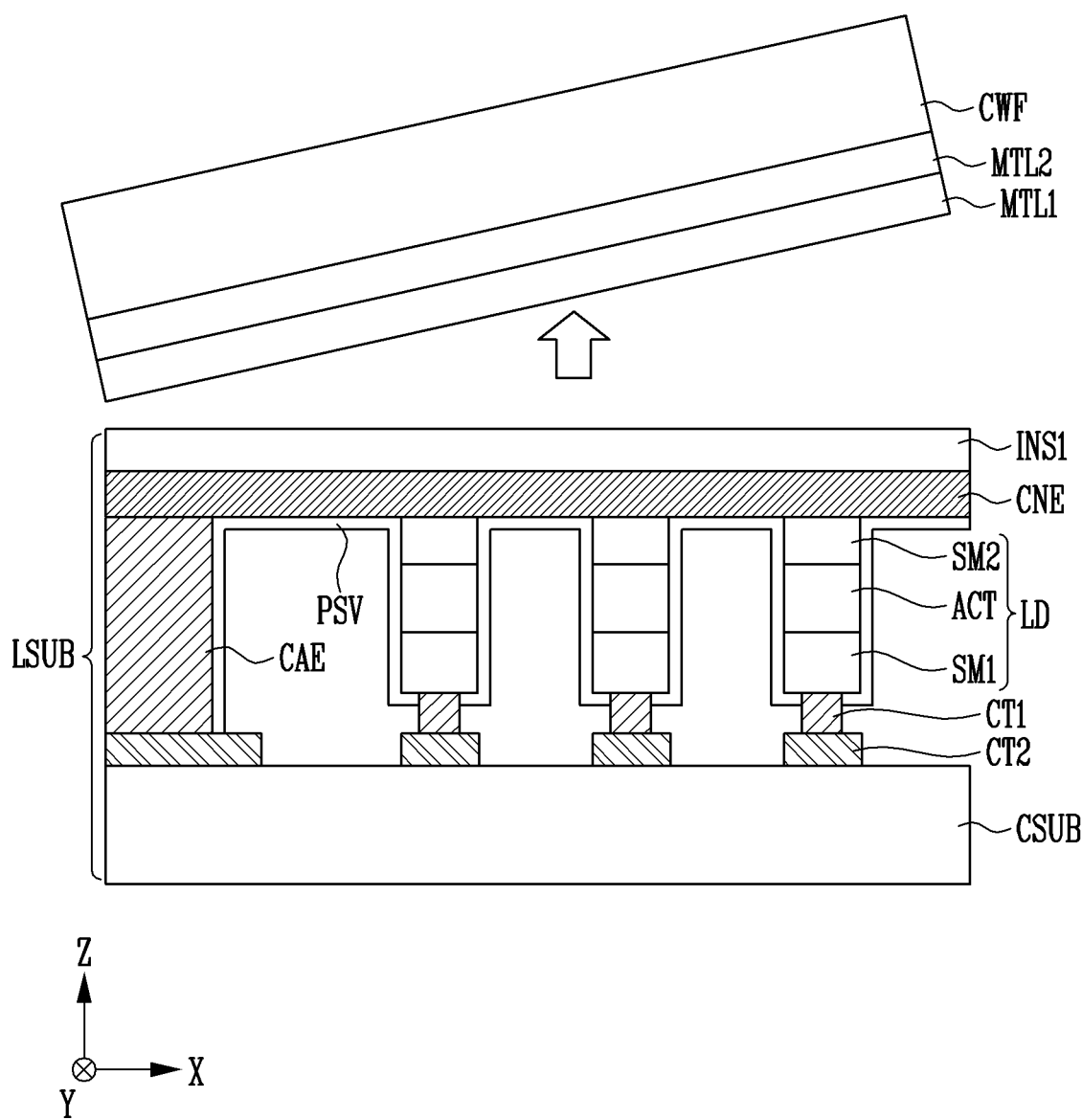

Referring to FIG. 8, the carrier substrate CWF may be first flipped. The common electrode CAE and the first contact electrodes CT1 and the second contact electrodes CT2 of the circuit substrate CSUB may be bonded. By separating the first metal layer MTL1 from the first insulation layer INS1, the manufacturing of the lower substrate LSUB of FIG. 3 may be completed.

Figure 9:
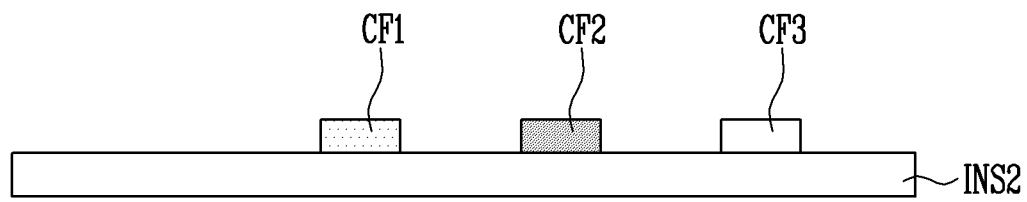
Figure 9:
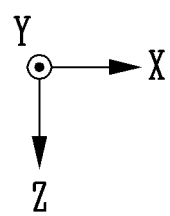

Referring to FIG. 9, the second insulation layer INS2 for manufacturing the upper substrate USUB of FIG. 3 may be provided. The color filters CF1, CF2, and CF3 may be formed on the second insulation layer INS2. The color filters CF1, CF2, and CF3 may be formed by using inkjet printing or photo resist, but the disclosure is not limited thereto.

Figure 10:
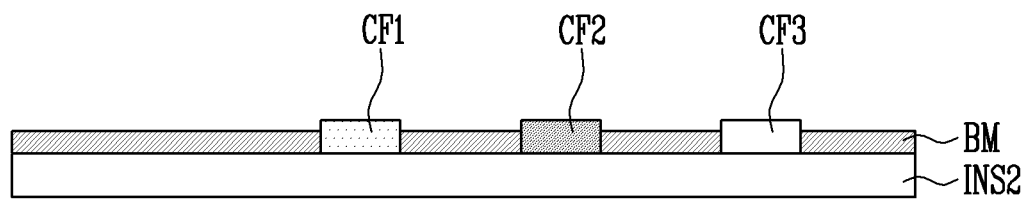
Figure 10:
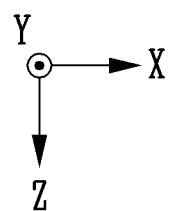

Referring to FIG. 10, the light block layer BM exposing the color filters CF1, CF2, and CF3 may be formed on the second insulation layer INS2.

Figure 11:
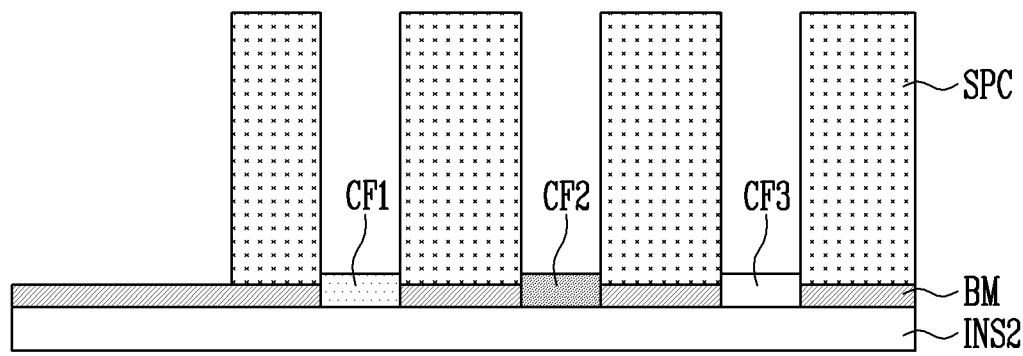
Figure 11:
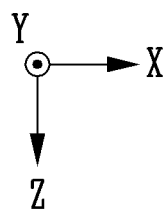

Referring to FIG. 11, the partition wall SPC having holes exposing the color filters CF1, CF2, and CF3 may be formed on the light block layer BM. As described above, for example, the partition wall SPC may be made of a photo resist, and may be manufactured through a photolithography process.

Figure 12:
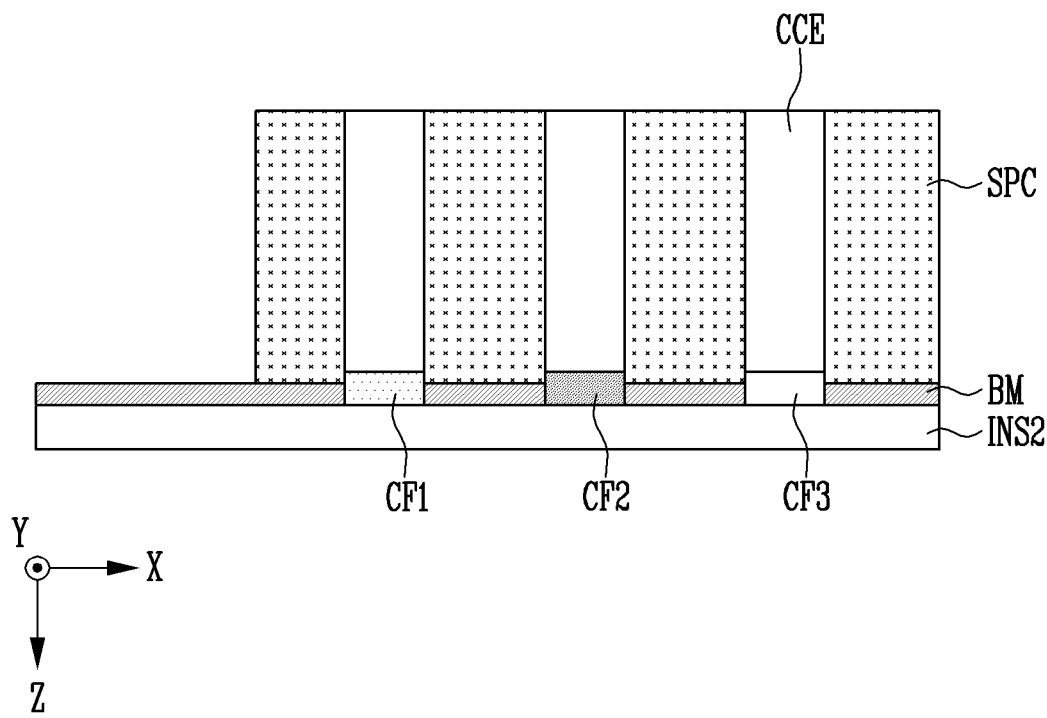

Referring to FIG. 12, the color conversion elements CCE may be formed inside the holes of the partition wall SPC. For example, the color conversion elements CCE may be injected into the holes by capillary action. In an embodiment, the color conversion elements CCE may be formed by using inkjet printing or photo resist.

Figure 13:
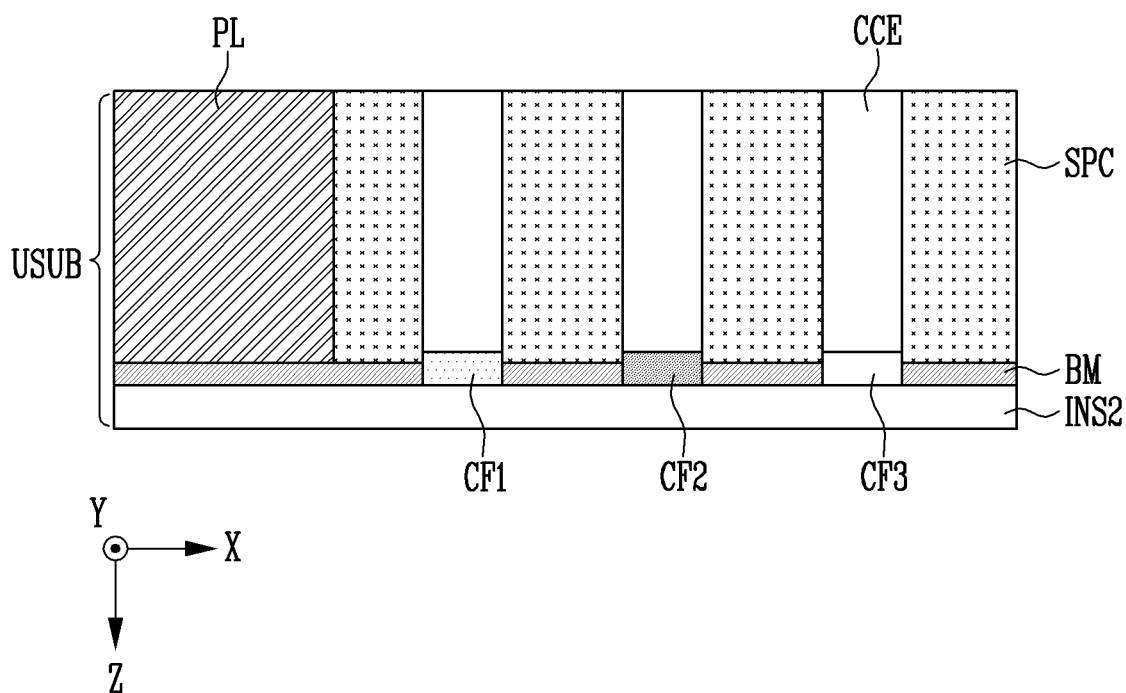

Referring to FIG. 13, the planarization layer PL may be formed on the light block layer BM. The planarization layer PL may be formed on a portion in which the partition wall SPC and the color conversion elements CCE are not present to planarize the upper substrate USUB. However, in an embodiment, in case that the partition wall SPC serves as the planarization layer PL, the process of forming the planarization layer PL may be omitted. Accordingly, the manufacture of the upper substrate USUB of FIG. 3 may be completed.

By bonding the partition wall SPC on the first insulation layer INS1, the lower substrate LSUB of FIG. 8 and the upper substrate USUB of FIG. 13 may be bonded, and the display panel PNL of FIG. 3 may be manufactured.

Figure 14:
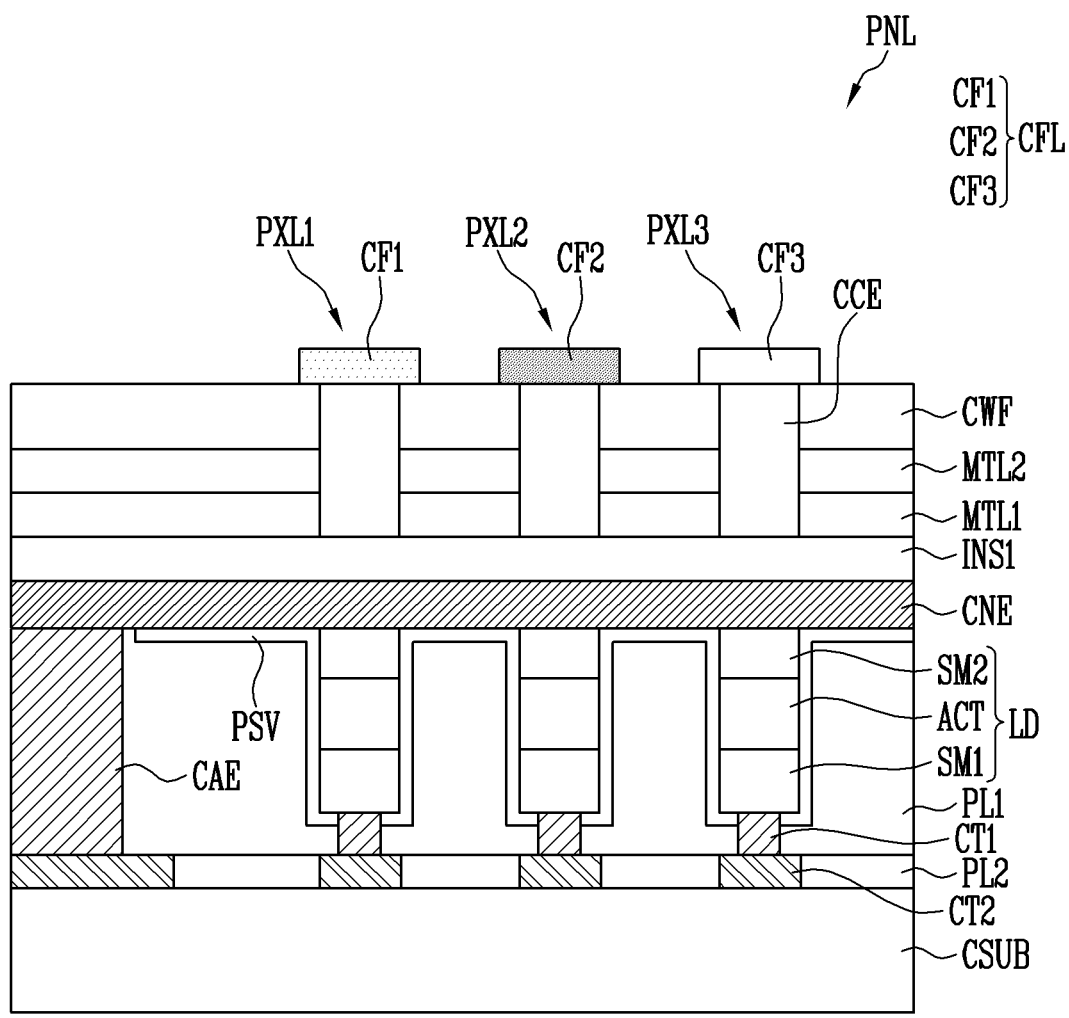
FIG. 14 is a schematic cross-sectional view of a structure of a display device according to an embodiment.

FIG. 14 is a schematic cross-sectional view of a structure of a display device according to an embodiment.

Referring to FIG. 14, a schematic cross-sectional view of an area in which an arbitrary first pixel PXL1, an arbitrary second pixel PXL2, and an arbitrary third pixel PXL3 are disposed among the display panel PNL of the display device is illustrated as an example. In FIG. 14 and the drawings therebelow, reference numerals common to respective pixels PXL1, PXL2, and PXL3 are not repeatedly denoted.

The circuit substrate CSUB may include the substrate SUB and the circuit elements formed on the substrate SUB as described above (see FIG. 1). For example, the circuit elements formed on the substrate SUB may include the pixel circuit PXC (see FIG. 2).

The second contact electrodes CT2 may be disposed on the circuit substrate CSUB, and may be respectively connected to the first contact electrodes CT1 and the common electrode CAE. The first contact electrodes CT1 may be disposed on the corresponding second contact electrodes CT2. The first contact electrodes CT1 may be respectively connected to the cathodes SM1 of the light emitting elements LD. The common electrode CAE may be disposed on the corresponding second contact electrode CT2.

The first and second contact electrodes CT1 and CT2 and the common electrode CAE may each include metal or a metal oxide. For example, the first and second contact electrodes CT1 and CT2 and the common electrode CAE are respectively copper (Cu), gold (Au), chromium (Cr), titanium (Ti), aluminum (Al), nickel (Ni), an indium tin oxide (ITO), an oxide or alloy thereof, and the like within the spirit and the scope of the disclosure. In the embodiment, the first and second contact electrodes CT1 and CT2 and the common electrode CAE may be made of the same material or a similar material. The first contact electrode CT1 and the second contact electrode CT2 may be readily bonded. The common electrode CAE and the second contact electrode CT2 may be readily bonded. However, the disclosure is not necessarily limited thereto, and materials included in the first and second contact electrodes CT1 and CT2 and the common electrode CAE may be variously changed.

The common electrode CAE may be connected to the first power line VDDL of the circuit substrate CSUB through the corresponding second contact electrode CT2 (see FIG. 2). The cathodes SM1 may be connected to the first electrode of the driving transistor (first transistor T1) of the circuit substrate CSUB through the corresponding first and second contact electrodes CT1 and CT2 (see FIG. 2).

A second planarization layer PL2 may surround side surfaces of the second contact electrodes CT2, and may expose the second contact electrodes CT2. A first planarization layer PL1 may surround side surfaces of the first contact electrodes CT1 and the common electrode CAE, and may expose the first contact electrodes CT1 and the common electrode CAE. The first planarization layer PL1 and the second planarization layer PL2 may fill a space other than a space in which the common electrode CAE and the first contact electrodes CT1 and the second contact electrodes CT2 are bonded. For example, the planarization layers PL1 and PL2 may be made of an organic material. For example, the planarization layers PL1 and PL2 may include an organic material such as an acrylates resin, an epoxy resin, a phenolic resin, a polyamides resin, a polyimides resin, a polyesters resin, a polyphenylenesulfides resin, or a benzocyclobutene (BCB). However, the disclosure is not necessarily limited thereto, and the planarization layers PL1 and PL2 may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The light emitting elements LD may have a structure in which the cathode SM1, an active layer ACT, and an anode SM2 may be sequentially stacked each other or grown. The cathodes SM1 may be disposed on the corresponding first contact electrode CT1. The anodes SM2 may contact a connection electrode CNE. The anodes SM2 may be commonly connected to the common electrode CAE through the connection electrode CNE. The anodes SM2, the connection electrode CNE, and the common electrode CAE may be electrically the same node. The active layer ACT may be disposed between the cathode SM1 and the anode SM2.

Each of the light emitting elements LD may be provided in various shapes. As an example, the light emitting elements LD may have a long (for example, an aspect ratio greater than 1) rod-like shape or bar-like shape in the third direction Z, but the disclosure is not limited thereto. For example, each of the light emitting elements LD may have a pillar shape in which a diameter of one end portion or an end portion thereof and a diameter of the other end portion or another end portion thereof are different from each other. The light emitting elements LD may be ultra-small light emitting diodes (LED) manufactured to have a diameter and/or a length of a nanometer scale to a micrometer scale. However, the disclosure is not necessarily limited thereto, and the size of the light emitting element LD may be variously changed to meet a required condition (or design condition) of a lighting device or a display device to which the light emitting element LD is applied.

The cathode SM1 may be made of a first semiconductor. For example, the cathode SM1 may be formed by etching the first semiconductor layer SM1L (see FIG. 5). In the embodiment, the first semiconductor may include at least one N-type semiconductor. For example, the first semiconductor may include a semiconductor material of one of GaN, InAlGaN, AlGaN, InGaN, AlN, and InN, and may be an N-type semiconductor doped with a first conductive dopant (or n-type dopant) such as Si, Ge, Sn, or the like within the spirit and the scope of the disclosure. For example, the first semiconductor layer may include a GaN semiconductor material doped with a dopant of first conductivity (or an N-type dopant). However, the material included in the first semiconductor is not limited thereto, and the first semiconductor may include various other materials.

The active layer ACT may have a single or multiple quantum well structure. For example, in case that the active layer ACT is formed of a multi-quantum well structure, the active layer ACT may have a structure in which a barrier layer (not shown), a strain reinforcing layer (not shown), and a well layer (not shown), which consist of one unit, may be periodically and repeatedly stacked each other. Since the strain reinforcing layer has a smaller lattice constant than that of the barrier layer, it may further reinforce strain applied to the well layer, for example, compressive strain. However, the structure of the active layer ACT is not limited to the above-described embodiment.

The active layer ACT may emit light having a wavelength of 400 nm to 900 nm, and may have a double heterostructure. In the embodiment, a clad layer (not shown) doped with a dopant of conductivity may be formed on an upper and/or lower portion of the active layer ACT. For example, the cladding layer may be formed of AlGaN or InAlGaN. In an embodiment, a material such as AlGaN and InAlGaN may be used to form the active layer ACT, and in addition, various materials may form the active layer ACT In case that a signal (or voltage) is applied to each end portion of the light emitting elements LD, while electron-hole pairs are combined in the active layer ACT, and each light emitting element LD emits light. By controlling the light emission of each light emitting element LD by using this principle, each light emitting element LD may be used as a light source (or light emitting source) for various light emitting devices in addition to the pixel PXL of the display device.

The anode SM2 may be made of a second semiconductor. For example, the anode SM2 may be formed by etching the second semiconductor layer SM2L (see FIG. 5). The second semiconductor may include a semiconductor of a different type from that of the first semiconductor. The second semiconductor may include, for example, at least one P-type semiconductor layer. For example, the second semiconductor may include at least one semiconductor material of GaN, InAlGaN, AlGaN, InGaN, AlN, and InN, and may include a P-type semiconductor doped with a second conductive dopant (or p-type dopant) such as Mg, Zn, Ca, Sr, and Ba. For example, the second semiconductor may include a GaN semiconductor material doped with a dopant of second conductivity (or a P-type dopant), but is not limited thereto, and various materials may form the second semiconductor.

In an embodiment, each of the light emitting elements LD may further include an additional layer or an additional electrode (not shown) disposed at one end portion or an end portion or the other end portion or another end portion in addition to the above-described cathode SM1, active layer ACT, and anode SM2. The additional electrode may be an ohmic contact electrode, but is not limited thereto. In an embodiment, the additional electrode may be a schottky contact electrode. The additional electrode may include a conductive material. For example, the additional electrode may include a transparent conductive oxide such as an indium tin oxide (ITO), an indium zinc oxide (IZO), a zinc oxide (ZnO), an indium gallium zinc oxide (IGZO), and an indium tin zinc oxide (ITZO), but is not limited thereto.

In an embodiment, the light emitting elements LD may further include a passivation film PSV formed on surfaces of the cathode SM1, the active layer ACT, and the anode SM2. The passivation film PSV is an insulating film, and may prevent an electrical short circuit that may occur in case that the active layer ACT contacts conductive materials other than the cathode SM1 and the anode SM2. The passivation film PSV may minimize surface defects of each light emitting element LD to improve lifespan and luminous efficiency of each light emitting element LD. In case that the light emitting elements LD are closely disposed, the passivation film PSV may prevent unwanted short circuits that may occur between the light emitting elements LD. For example, the passivation film PSV may be a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The connection electrode CNE may connect the anodes SM2 and the common electrode CAE. For example, the connection electrode CNE may cover or overlap the common electrode CAE, the passivation film PSV, and the anodes SM2. The connection electrode CNE may be a transparent electrode. For example, the connection electrode may include a transparent conductive oxide such as an indium tin oxide (ITO), an indium zinc oxide (IZO), a zinc oxide (ZnO), an indium gallium zinc oxide (IGZO), and an indium tin zinc oxide (ITZO), but is not limited thereto.

The first insulation layer INS1 may cover or overlap the connection electrode CNE. The first insulation layer INS1 may be made of an inorganic material. For example, the first insulation layer INS1 may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide (ZrO$_x$), a hafnium oxide (HfO$_x$), or a titanium oxide (TiO$_x$), and various types of inorganic materials. However, the disclosure is not necessarily limited thereto, and the first insulation layer INS1 may be made of an organic material. For example, the first insulation layer INS1 may include an organic material such as an acrylates resin, an epoxy resin, a phenolic resin, a polyamides resin, a polyimides resin, a polyesters resin, a polyphenylenesulfides resin, or a benzocyclobutene (BCB).

The first metal layer MTL1 may be disposed on the first insulation layer INS1. The second metal layer MTL2 may be disposed on the first metal layer MTL1. In case that the first metal layer MTL1 and the second metal layer MTL2 are made of the same material or a similar material, the first metal layer MTL1 and the second metal layer MTL2 may be expressed as one layer or a layer.

Each of the first metal layer MTL1 and the second metal layer MTL2 may be made of metal or a metal oxide. For example, each of the first metal layer MTL1 and the second metal layer MTL2 may be made of copper (Cu), gold (Au), chromium (Cr), titanium (Ti), aluminum (Al), nickel (Ni), an indium tin oxide (ITO), and an oxides or alloy thereof. In the embodiment, the first metal layer MTL1 and the second metal layer MTL2 may be made of the same material or a similar material. The first metal layer MTL1 and the second metal layer MTL2 may be readily bonded to each other, but the disclosure is not limited thereto. Materials included in the first metal layer MTL1 and the second metal layer MTL2 may be variously changed.

The carrier substrate CWF may be disposed on the second metal layer MTL2. The carrier substrate CWF may be a silicon wafer. On the other hand, the carrier substrate CWF may be made of a light-transmitting material, for example, at least one of sapphire (AL$_2$O$_3$), a single crystal substrate, SiC, GaAs, GaN, ZnO, AlN, Si, GaP, InP, and Ge.

The first metal layer MTL1, the second metal layer MTL2, and the carrier substrate CWF may include holes for receiving the color conversion elements CCE. These holes may be disposed to overlap the light emitting elements LD of respective pixel PXL1, PXL2, and PXL3 in the third direction Z.

The color conversion elements CCE may be disposed on the first insulation layer INS1 to overlap the light emitting elements LD. The color conversion elements CCE may overlap the corresponding light emitting elements LD in the third direction Z. In the embodiment, the color conversion elements CCE may be injected into the holes of the first metal layer MTL1, the second metal layer MTL2, and the carrier substrate CWF by capillary action. A high resolution display device may be realized beyond a limit of a photo process or inkjet process.

The color conversion elements CCE may include quantum dots that convert light emitted from the light emitting elements LD of each pixel PXL into light of a color. For example, the color conversion elements CCE may include quantum dots dispersed in a matrix material such as a base resin.

In the embodiment, the first to third pixels PXL1, PXL2, and PXL3 may include the light emitting elements LD that emit light of a same color. For example, the first to third pixels PXL1, PXL2, and PXL3 may include the light emitting elements LD that emit light of a third color (or blue color). The color conversion elements CCE may include quantum dots that convert blue light emitted from the light emitting element LD into white light. An absorption coefficient of the quantum dot may be increased by irradiating blue light having a relatively short wavelength in the visible light region to the quantum dots. Accordingly, light efficiency finally emitted from the pixels PXL may be improved, and simultaneously, excellent color reproducibility may be secured. The light emitting unit EMU of the first to third pixels PXL1, PXL2, and PXL3 may be formed by using the light emitting elements LD of a same color (for example, the blue color light emitting element), thereby increasing the manufacturing efficiency of the display device. However, the disclosure is not necessarily limited thereto, the first to third pixels PXL1, PXL2, and PXL3 may include light emitting elements LD that emit light of different colors. For example, the first pixel PXL1 may include a first color (or red color) light emitting element LD, the second pixel PXL2 may include a second color (or green color) light emitting element LD, and the third pixel PXL3 may include a third color (or blue color) light emitting element LD.

The color filters CFL may cover or overlap the color conversion elements CCE on the carrier substrate CWF. A full-color image may be displayed by disposing color filters CF1, CF2, and CF3 matching respective colors of the first to third pixels PXL1, PXL2, and PXL3. The first color filter CF1 may be disposed on the color conversion element CCE corresponding to the first pixel PXL1 to selectively transmit light emitted from the first pixel PXL1. The second color filter CF2 may be disposed on the color conversion element CCE corresponding to the second pixel PXL2 to selectively transmit light emitted from the second pixel PXL2. The third color filter CF3 may be disposed on the color conversion element CCE corresponding to the third pixel PXL3 to selectively transmit light emitted from the third pixel PXL3.

In the embodiment, the first color filter CF1, the second color filter CF2, and the third color filter CF3 may be a red color filter, a green color filter, and a blue color filter respectively, but the disclosure is not limited necessarily thereto.

The first color filter CF1 may overlap the light emitting element LD and color conversion element CCE of the first pixel PXL1 in the third direction Z. The first color filter CF1 may include a color filter material that selectively transmits light of a first color (or red color). For example, in case that the first pixel PXL1 is a red pixel, the first color filter CF1 may include a red color filter material.

The second color filter CF2 may overlap the light emitting element LD and color conversion element CCE of the second pixel PXL2 in the third direction Z. The second color filter CF2 may include a color filter material that selectively transmits light of a second color (or green color). For example, in case that the second pixel PXL2 is a green pixel, the second color filter CF2 may include a green color filter material.

The third color filter CF3 may overlap the light emitting element LD and color conversion element CCE of the third pixel PXL3 in the third direction Z. The third color filter CF3 may include a color filter material that selectively transmits light of a third color (or blue color). For example, in case that the third pixel PXL3 is a blue pixel, the third color filter CF3 may include a blue color filter material.

In the display device according to the embodiment, as the anodes SM2 of the light emitting elements LD are commonly connected to the common electrode CAE, the connection relationship between the light emitting unit EMU and the pixel circuit PXC as shown in FIG. 2 may be formed. Since a sink current of the pixel circuit PXC is used for light emitting of the light emitting unit EMU, an internal current of the pixel circuit PXC is not used, thereby reducing current consumption and a load.

FIG. 15 to FIG. 19 are schematic cross-sectional views of a manufacturing method of the display device of FIG. 14.

Since the manufacturing steps of FIG. 4 to FIG. 6 may also be applied to the display device of FIG. 14, a redundant description thereof will be omitted.

Referring to FIG. 15, the light emitting elements LD may be formed by etching the first semiconductor layer SM1L, the active layer ACTL, and the second semiconductor layer SM2L (see FIG. 7). As described above with reference to FIG. 14, each of the light emitting elements LD may include the cathode SM1, the active layer ACT, and the anode SM2. The light emitting elements LD may be formed at positions corresponding to the first to third pixels PXL1, PXL2, and PXL3, respectively. The etching process of the light emitting laminate may be performed by a dry etching method, a wet etching method, a reactive ion etching (ME) method, and an inductively coupled plasma reactive ion etching (ICP-RIE) method.

The passivation film PSV covering or overlapping the light emitting elements LD may be formed. An opening exposing the first semiconductor layer SM1L of the light emitting elements LD, for example, the cathode SM1, may be formed in the passivation film PSV.

The first planarization layer PL1 covering or overlapping the passivation film PSV and the connection electrode CNE may be formed. The first planarization layer PL1 may be etched to expose a portion of the connection electrode CNE and the first semiconductor layer SM1L of the light emitting elements LD, for example, the cathode SM1.

Referring to FIG. 16, a third metal layer MTL3 may be formed on the first planarization layer PL1, and on the first semiconductor layer SM1L, for example, the cathodes SM1. For example, the third metal layer MTL3 may be formed by depositing a copper (Cu) seed and performing copper plating.

Referring to FIG. 17, the common electrode CAE and the first contact electrodes CT1 may be formed by polishing the third metal layer MTL3. The common electrode CAE and the first contact electrodes CT1 may be simultaneously formed in the same process. The polishing process may be a chemical mechanical polish (CMP) process. The common electrode CAE and the first contact electrodes CT1 may be made of the same material or a similar material.

Figure 18:
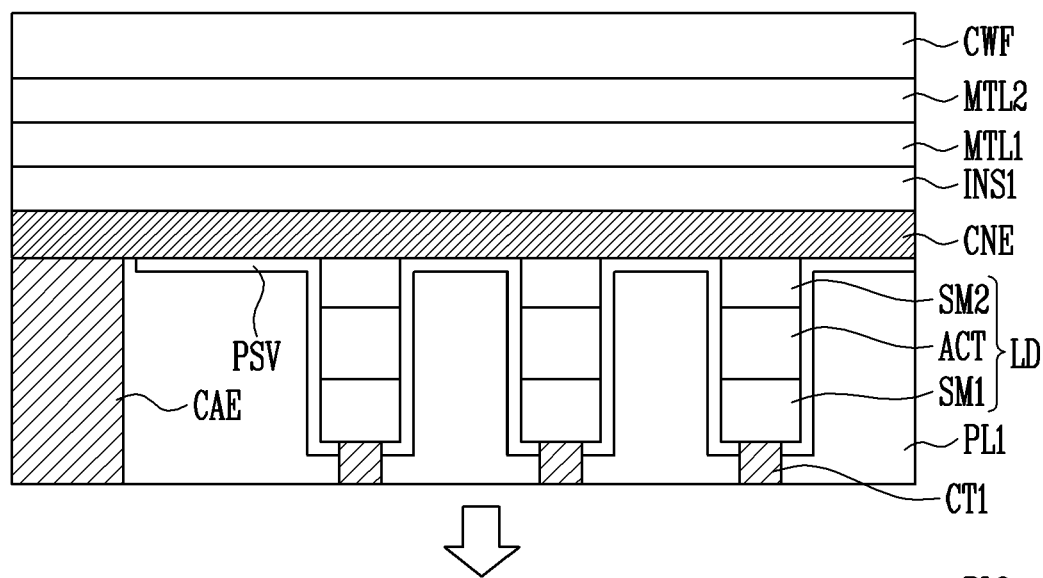

Referring to FIG. 18, the second contact electrodes CT2 and the second planarization layer PL2 may be formed on the circuit substrate CSUB. For example, the second planarization layer PL2 may be formed on the circuit substrate CSUB, and the second planarization layer PL2 may be etched to form via holes. A metal layer may be formed by depositing a copper (Cu) seed and performing copper plating, and the second contact electrodes CT2 and the second planarization layer PL2 may be polished by performing a chemical mechanical polish (CMP) process.

After flipping the carrier substrate CWF, the second contact electrodes CT2, the common electrode CAE, and the first contact electrodes CT1 on the circuit substrate CSUB may be bonded. The bonding may be wafer-to-wafer (W2W) bonding.

Figure 19:
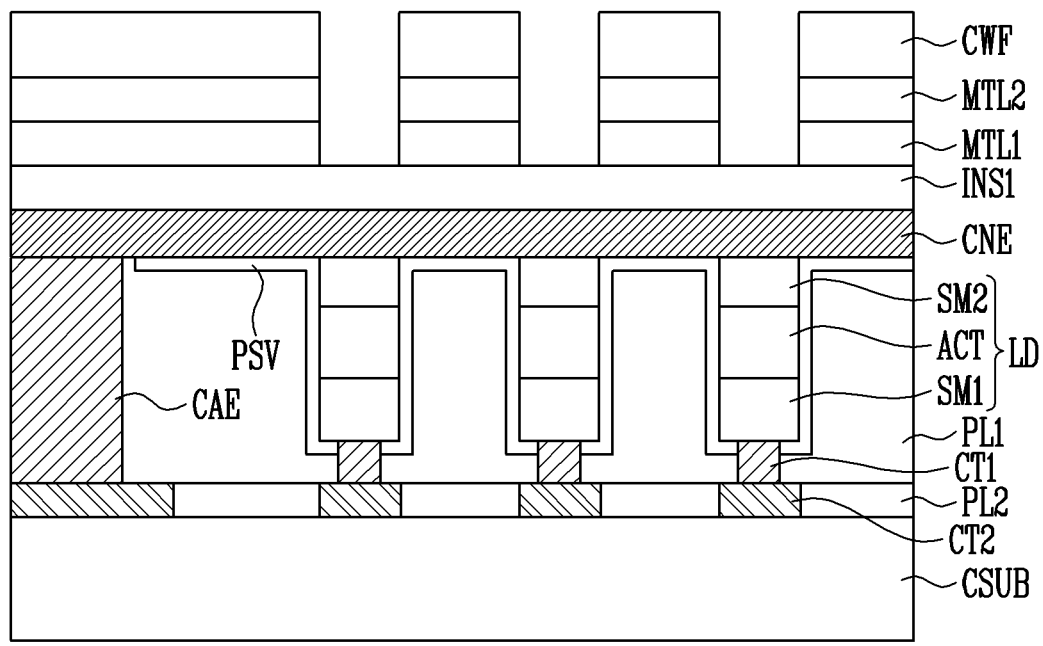

Referring to FIG. 19, holes may be formed by etching the carrier substrate CWF, the second metal layer MTL2, and the first metal layer MTL1. The color conversion elements CCE are formed in the holes, and the color filters CFL covering or overlapping the color conversion elements CCE and the carrier substrate CWF are formed to be able to manufacture the display panel PNL of FIG. 14.

FIG. 20 to FIG. 23 are, for example, schematic diagrams illustrating a smart glass, a head mounted display, a smart watch, and an automotive display as application examples of the display device.

Figure 20:
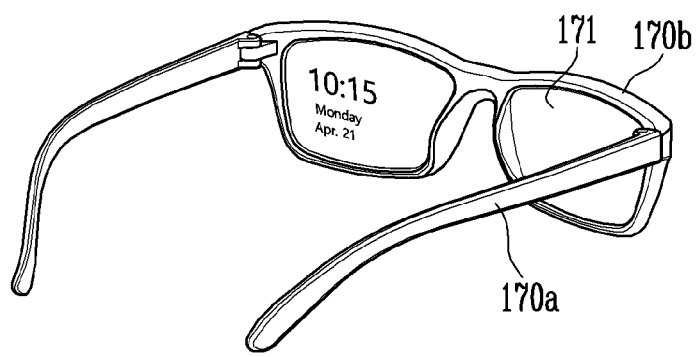
FIG. 20 to FIG. 23 are application examples of a display device, for example, schematic diagrams illustrating a smart glass, a head mounted display, a smart watch, and an automotive display.

Referring to FIG. 20, the display device according to the embodiment may be applied to a smart glass including a frame 170 and a lens part 171. The smart glass is a wearable electronic device that may be worn on a user's face, and may have a structure in which a portion of the frame 170 is folded or unfolded. For example, the smart glass may be a wearable device for augmented reality (AR).

The frame 170 may include a housing 170*b* supporting the lens part 171 and a leg part 170*a* for a user to wear. The leg part 170*a* may be connected or coupled to the housing 170*b* by a hinge to be folded or unfolded.

A battery, a touch pad, a microphone, and a camera may be embedded in the frame 170. A projector that outputs light and a processor that controls an optical signal and the like may be embedded in the frame 170.

The lens part 171 may be an optical member that transmits light or reflects light. The lens part 171 may include glass, a transparent synthetic resin, or the like within the spirit and the scope of the disclosure.

The lens part 171 may reflect an image by an optical signal transmitted from the projector of the frame 170 by a rear surface (for example, a surface of a direction directed to the user's eyes) of the lens part 171, so that it is possible to allow the user's eyes to recognize it. For example, the user may recognize information such as time and date displayed on the lens part 171 as shown in the drawing. For example, the lens part 171 is a kind of display device, and the display device according to the above-described embodiment may be applied to the lens part 171.

Figure 21:
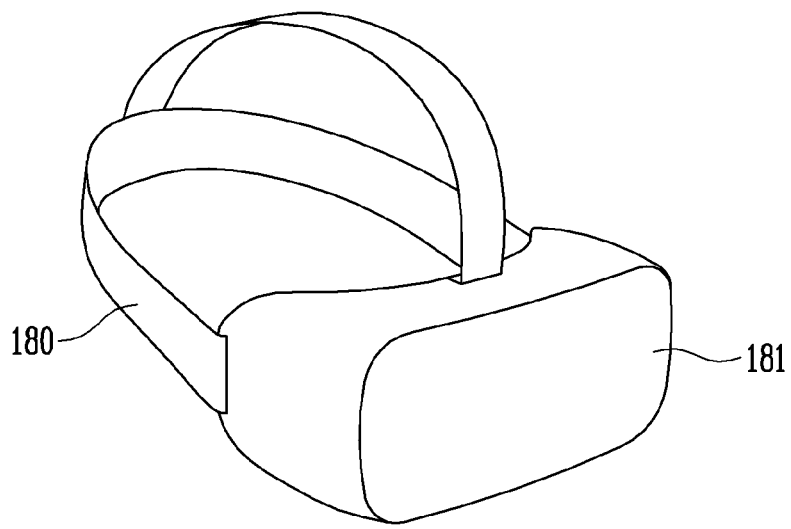

Referring to FIG. 21, the display device according to the embodiment may be applied to a head mounted display (HMD) including a head mounting band 180 and a display receiving case 181. The head mounted display is a wearable electronic device that may be worn on the user's head.

The head mounting band 180 is connected to the display receiving case 181 to fix the display receiving case 181. In the drawing, the head mounting band 180 has been shown to surround an upper side of the user's head and both sides thereof, but the disclosure is not limited thereto. The head mounting band 180 is for fixing the head mounted display to the user's head, and may be formed in a form of a spectacle frame or a helmet.

The display receiving case 181 accommodates the display device, and may include at least one lens. The at least one lens is a part that provides an image to the user. For example, the display device according to the embodiment may be applied to a left eye lens and a right eye lens implemented in the display receiving case 181.

Figure 22:
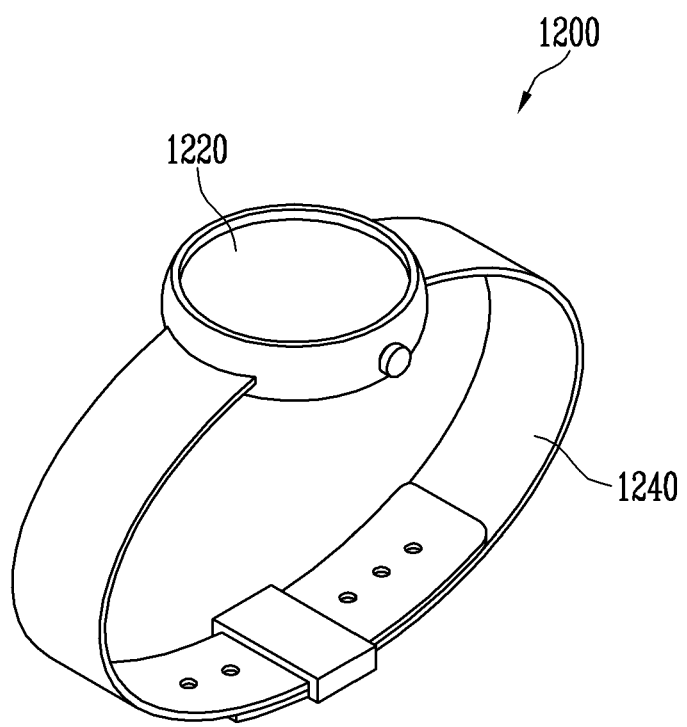

Referring to FIG. 22, the display device according to the embodiment may be applied to a smart watch 1200 including a display part 1220 and a strap part 1240.

The smart watch 1200 is a wearable electronic device, and may have a structure in which the strap part 1240 is mounted on a user's wrist. Here, the display device according to the embodiment is applied to the display part 1220, so that image data including time information may be provided to the user.

Figure 23:
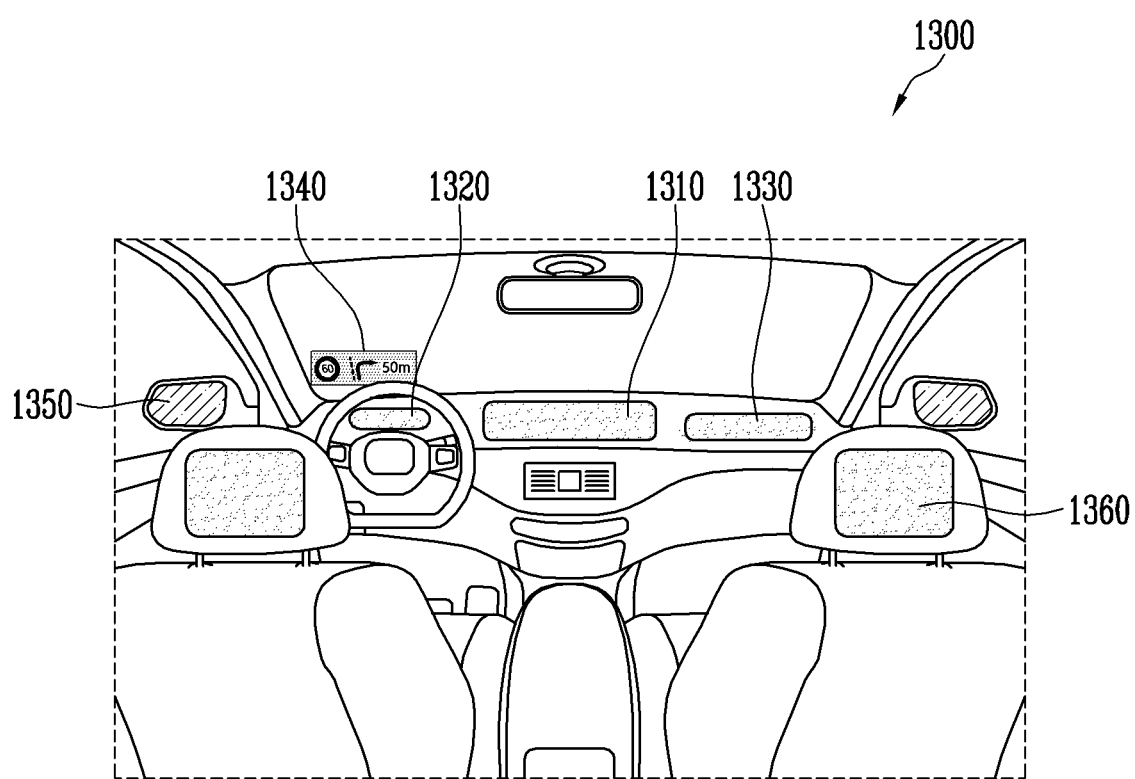

Referring to FIG. 23, the display device according to the embodiment may be applied to an automotive display 1300. Here, the automotive display 1300 may refer to an electronic device provided inside of and outside of a vehicle to provide image data.

For example, the display device may be applied to at least one of an infotainment panel 1310, a cluster 1320, a co-driver display 1330, a head-up display 1340, a side mirror display 1350, and a rear-seat display 1360, which are provided in the vehicle.

Figure 24:
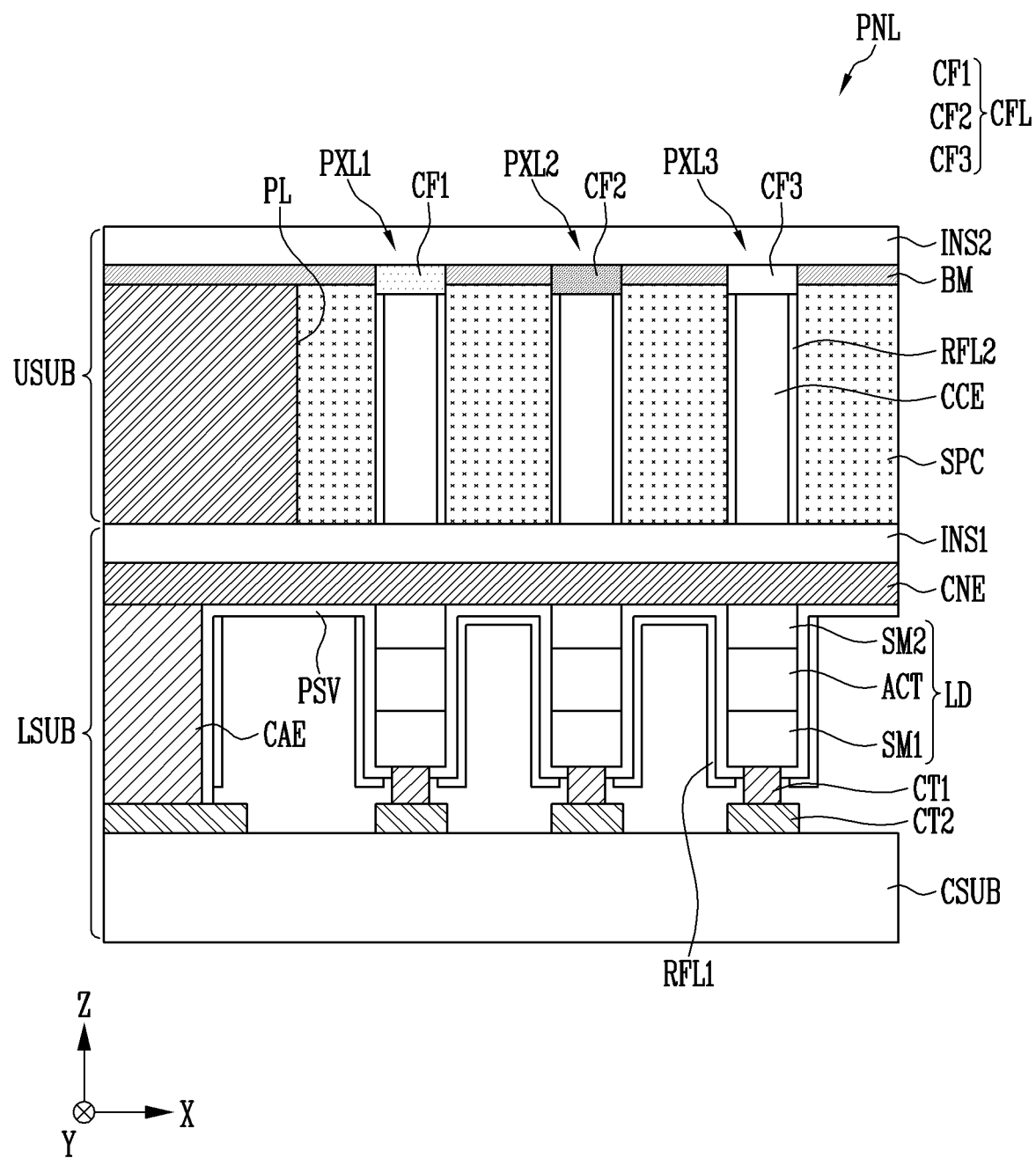
FIG. 24 is a schematic cross-sectional view of a variation of the embodiments of FIG. 3 to FIG. 13.

FIG. 24 is a schematic cross-sectional view of a variation of the embodiments of FIG. 3 to FIG. 13.

Referring to FIG. 24, compared to FIG. 3, the display panel PNL may further selectively include a first reflective member RFL1 and a second reflective member RFL2. For example, the display panel PNL may further include only the first reflective member RFL1. As another example, the display panel PNL may further include only the second reflective member RFL2. As another example, the display panel PNL may further include the first reflective member RFL1 and the second reflective member RFL2.

The first reflective member RFL1 may cover or overlap the side surfaces of the light emitting elements LD. For example, the first reflective member RFL1 may be formed on the passivation film PSV covering or overlapping the side surfaces of the light emitting elements LD. A thickness of the first reflective member RFL1 may be 1 nm to 100 nm, but is not limited thereto. The first reflective member RFL1 may include a reflective material. For example, the first reflective member RFL1 may include an Al-based or Ag-based material, but is not limited thereto. The first reflective member RFL1 reflects the light emitted from the light emitting element LD in a display direction (for example, the third direction Z) of the display device, thereby improving luminous efficiency.

In case that the display panel PNL may include the first reflective member RFL1, a step of forming the first reflective member RFL1 may be added after forming and etching the passivation film PSV among the manufacturing steps of FIG. 7. For example, the first reflective member RFL1 may be formed by depositing aluminum on the passivation film PSV and etching the aluminum to expose the cathode SM1.

The second reflective member RFL2 may cover or overlap the side surfaces of the color conversion elements CCE. For example, the second reflective member RFL2 may be formed on portions (for example, inner walls of holes) of the partition wall SPC facing the side surfaces of the color conversion elements CCE. The second reflective member RFL2 may include a reflective material. For example, the second reflective member RFL2 may include an Al-based or Ag-based material, but is not limited thereto. The second reflective member RFL2 may reflect the light transmitting through the color conversion element CCE in the display direction (for example, the third direction Z) of the display device, thereby improving luminous efficiency.

In case that the display panel PNL may include the second reflective member RFL2, a step of forming the second reflective member RFL2 may be added after forming the holes of the partition wall SPC in the manufacturing step of FIG. 11. The second reflective member RFL2 may be formed by depositing a reflective material on the partition wall SPC and etching the reflective material to expose the color filters CF1, CF2, and CF3.

Figure 25:
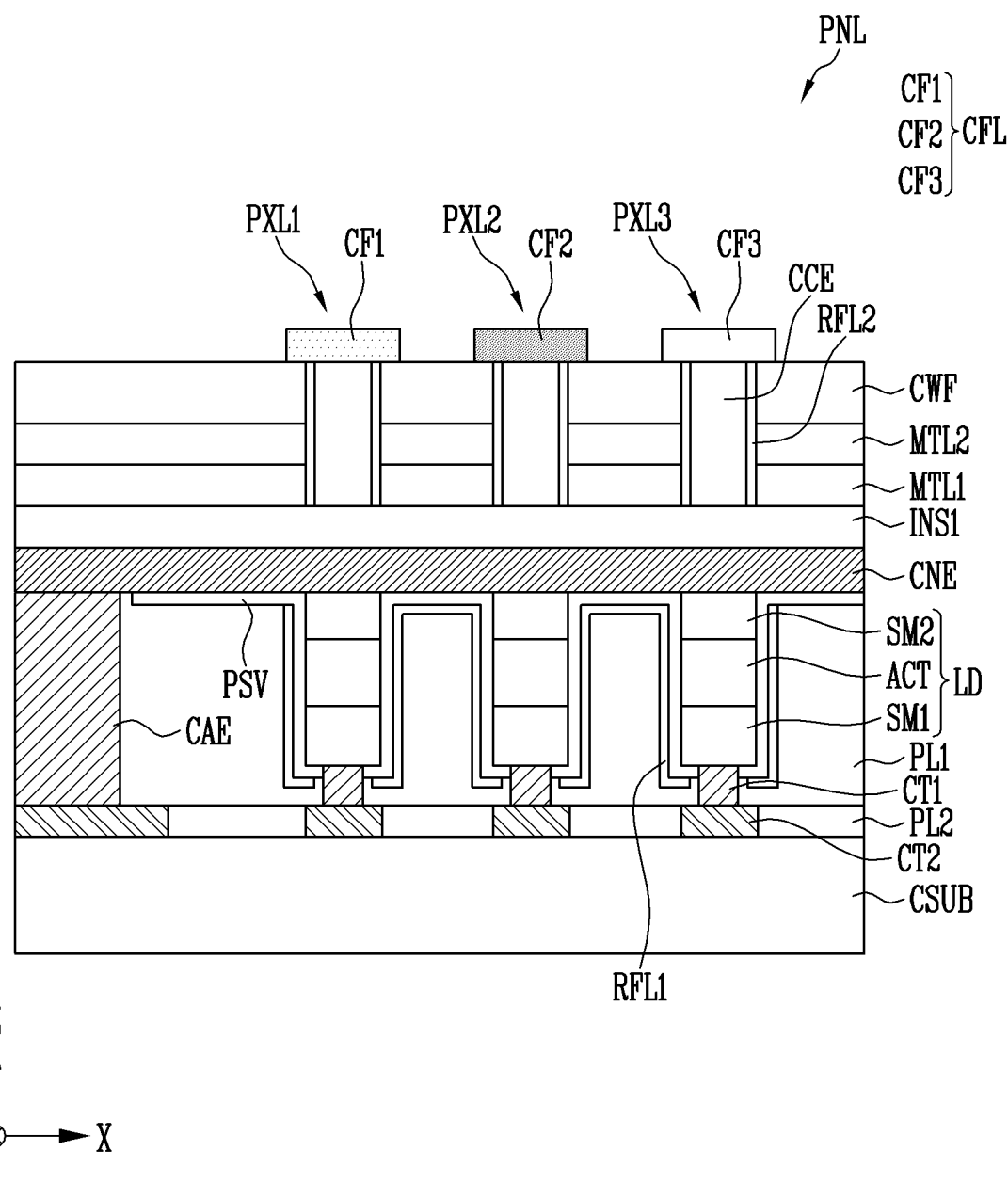
FIG. 25 is a schematic cross-sectional view of a variation of the embodiments of FIG. 14 to FIG. 19.

FIG. 25 is a schematic cross-sectional view of a variation of the embodiments of FIG. 14 to FIG. 19.

Referring to FIG. 25, compared to FIG. 14, the display panel PNL may further selectively include the first reflective member RFL1 and the second reflective member RFL2. For example, the display panel PNL may further include only the first reflective member RFL1. As another example, the display panel PNL may further include only the second reflective member RFL2. As another example, the display panel PNL may further include the first reflective member RFL1 and the second reflective member RFL2.

The first reflective member RFL1 may cover or overlap the side surfaces of the light emitting elements LD. For example, the first reflective member RFL1 may be formed on the passivation film PSV covering or overlapping the side surfaces of the light emitting elements LD. A thickness of the first reflective member RFL1 may be 1 nm to 100 nm, but is not limited thereto. The first reflective member RFL1 may include a reflective material. For example, the first reflective member RFL1 may include an Al-based or Ag-based material, but is not limited thereto. The first reflective member RFL1 reflects the light emitted from the light emitting element LD in a display direction (for example, the third direction Z) of the display device, thereby improving luminous efficiency.

In case that the display panel PNL may include the first reflective member RFL1, a step of forming the first reflective member RFL1 may be added after forming and etching the passivation film PSV among the manufacturing steps of FIG. 15. For example, the first reflective member RFL1 may be formed by depositing aluminum on the passivation film PSV and etching the aluminum to expose the cathode SM1.

The second reflective member RFL2 may cover or overlap the side surfaces of the color conversion elements CCE. For example, the second reflective member RFL2 may be formed on inner walls of holes facing the side surfaces of the color conversion elements CCE. The second reflective member RFL2 may include a reflective material. For example, the second reflective member RFL2 may include an Al-based or Ag-based material, but is not limited thereto. The second reflective member RFL2 may reflect the light transmitting through the color conversion element CCE in the display direction (for example, the third direction Z) of the display device, thereby improving luminous efficiency.

In case that the display panel PNL may include the second reflective member RFL2, a step of forming the second reflective member RFL2 may be added after forming the holes in the manufacturing step of FIG. 19. For example, the second reflective member RFL2 may be formed by depositing the reflective material on the inner walls of the holes and etching the reflective material to expose the first insulation layer INS1.

Figure 26:
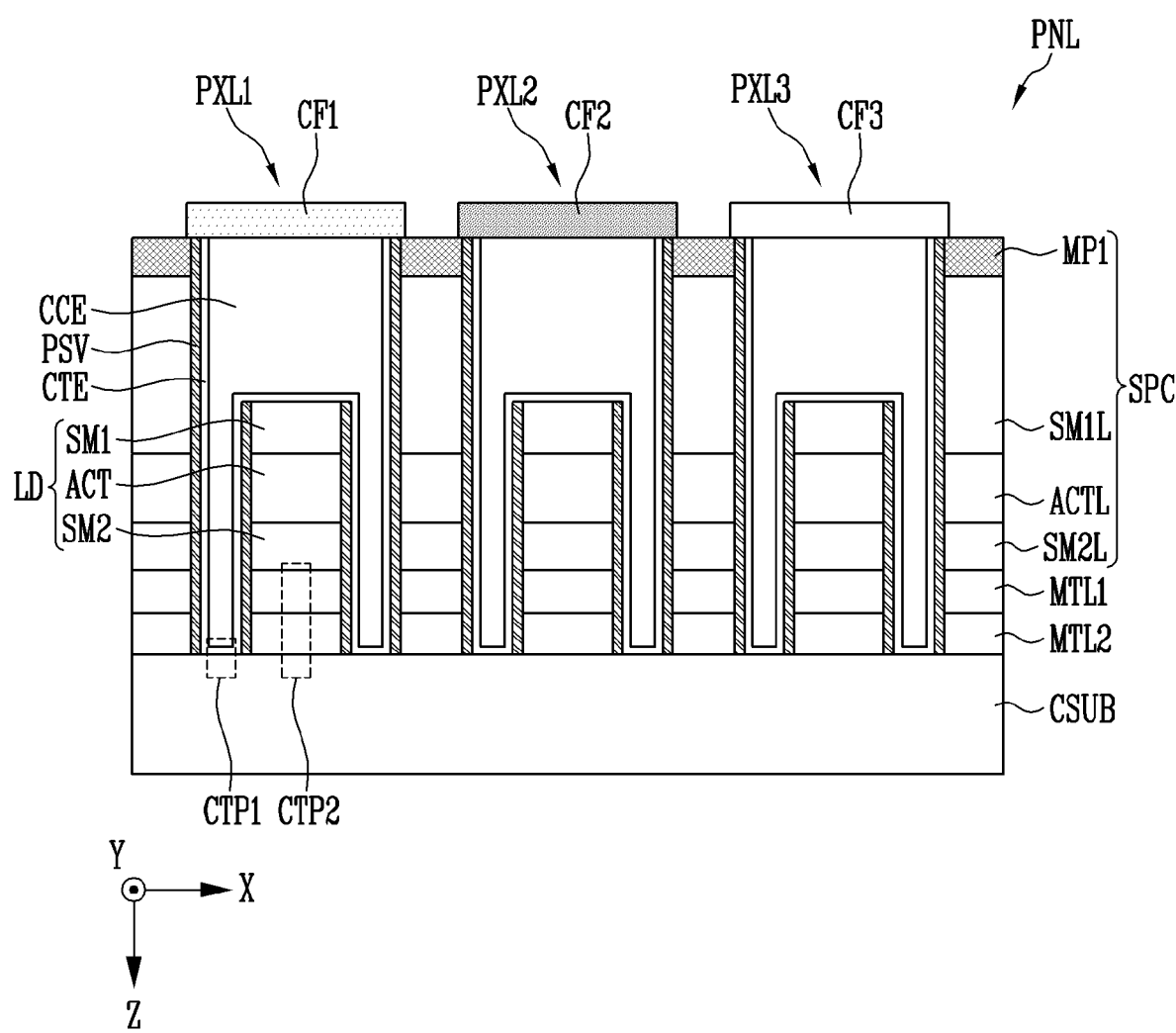
FIG. 26 is a schematic cross-sectional view of a structure of a display device according to an embodiment.

FIG. 26 is a schematic cross-sectional view of a structure of a display device according to an embodiment.

Referring to FIG. 26, a schematic cross-sectional view of an area in which an arbitrary first pixel PXL1, an arbitrary second pixel PXL2, and an arbitrary third pixel PXL3 are disposed among the display panel PNL of the display device is illustrated as an example. In FIG. 26 and the drawings therebelow, reference numerals common to respective pixels PXL1, PXL2, and PXL3 are not repeatedly denoted.

The circuit substrate CSUB may include the substrate SUB and the circuit elements formed on the substrate SUB as described above (see FIG. 1). For example, the circuit elements formed on the substrate SUB may include the pixel circuit PXC (see FIG. 2).

The second metal layer MTL2 may be disposed on the circuit substrate CSUB. The first metal layer MTL1 may be disposed on the second metal layer MTL2. In case that the first metal layer MTL1 and the second metal layer MTL2 are made of the same material or a similar material, the first metal layer MTL1 and the second metal layer MTL2 may be expressed as one layer or a layer.

Each of the first metal layer MTL1 and the second metal layer MTL2 may be made of metal or a metal oxide. For example, each of the first metal layer MTL1 and the second metal layer MTL2 may be made of copper (Cu), gold (Au), chromium (Cr), titanium (Ti), aluminum (Al), nickel (Ni), an indium tin oxide (ITO), and an oxides or alloy thereof. In the embodiment, the first metal layer MTL1 and the second metal layer MTL2 may be made of the same material or a similar material. The first metal layer MTL1 and the second metal layer MTL2 may be readily bonded to each other, but the disclosure is not limited thereto. Materials included in the first metal layer MTL1 and the second metal layer MTL2 may be variously changed.

The first metal layer MTL1 and the second metal layer MTL2 may be disposed in an overlapping area with the partition wall SPC and the light emitting elements LD in the third direction Z. In the first metal layer MTL1 and the second metal layer MTL2, portions that do not overlap the partition wall SPC and the light emitting elements LD in the third direction Z may be etched and may not exist.

The partition wall SPC and the light emitting elements LD may be disposed on the first metal layer MTL1 and the second metal layer MTL2. The partition wall SPC and the light emitting elements LD may be spaced apart from each other. Each of the light emitting elements LD may be surrounded by the partition wall SPC based on a plane.

The light emitting elements LD may have a structure in which the anode SM2, the active layer ACT, and the cathode SM1 may be sequentially stacked each other or grown. The anode SM2 may be disposed on the first metal layer MTL1. The active layer ACT may be disposed on the anode SM2. The cathode SM1 may be disposed on the active layer ACT.

Each of the light emitting elements LD may be provided in various shapes. As an example, the light emitting elements LD may have a long (for example, an aspect ratio greater than 1) rod-like shape or bar-like shape in the third direction Z, but the disclosure is not limited thereto. For example, each of the light emitting elements LD may have a pillar shape in which a diameter of one end portion or another end portion thereof and a diameter of the other end portion or another end portion thereof are different from each other. The light emitting elements LD may be ultra-small light emitting diodes (LED) manufactured to have a diameter and/or a length of a nanometer scale to a micrometer scale. However, the disclosure is not necessarily limited thereto, and the size of the light emitting element LD may be variously changed to meet a required condition (or design condition) of a lighting device or a display device to which the light emitting element LD is applied.

The anode SM2 may be made of a second semiconductor. For example, the anode may be formed by etching the second semiconductor layer SM2L. The second semiconductor may include a semiconductor of a different type from that of the first semiconductor. The second semiconductor may include, for example, at least one P-type semiconductor layer. For example, the second semiconductor may include at least one semiconductor material of GaN, InAlGaN, AlGaN, InGaN, AlN, and InN, and may include a P-type semiconductor doped with a second conductive dopant (or p-type dopant) such as Mg, Zn, Ca, Sr, and Ba. For example, the second semiconductor may include a GaN semiconductor material doped with a dopant of second conductivity (or a P-type dopant), but is not limited thereto, and various materials may form the second semiconductor.

The active layer ACT may have a single or multiple quantum well structure. For example, in case that the active layer ACT is formed of a multi-quantum well structure, the active layer ACT may have a structure in which a barrier layer (not shown), a strain reinforcing layer (not shown), and a well layer (not shown), which consist of one unit, may be periodically and repeatedly stacked each other. Since the strain reinforcing layer has a smaller lattice constant than that of the barrier layer, it may further reinforce strain applied to the well layer, for example, compressive strain. However, the structure of the active layer ACT is not limited to the above-described embodiment.

The active layer ACT may emit light having a wavelength of 400 nm to 900 nm, and may have a double heterostructure. In the embodiment, a clad layer (not shown) doped with a dopant of conductivity may be formed on an upper and/or lower portion of the active layer ACT. For example, the cladding layer may be formed of AlGaN or InAlGaN. In an embodiment, a material such as AlGaN and InAlGaN may be used to form the active layer ACT, and in addition, various materials may form the active layer ACT.

In case that a signal (or voltage) is applied to each end portion of the light emitting elements LD, while electron-hole pairs are combined in the active layer ACT, and each light emitting element LD emits light. By controlling the light emission of each light emitting element LD by using this principle, each light emitting element LD may be used as a light source (or light emitting source) for various light emitting devices in addition to the pixel PXL of the display device.

The cathode SM1 may be made of a first semiconductor. For example, the cathode may be formed by etching the first semiconductor layer SM1L. In the embodiment, the first semiconductor may include at least one N-type semiconductor. For example, the first semiconductor may include a semiconductor material of one of GaN, InAlGaN, AlGaN, InGaN, AlN, and InN, and may be an N-type semiconductor doped with a first conductive dopant (or n-type dopant) such as Si, Ge, Sn, or the like within the spirit and the scope of the disclosure. For example, the first semiconductor layer may include a GaN semiconductor material doped with a dopant of first conductivity (or an N-type dopant). However, the material included in the first semiconductor is not limited thereto, and the first semiconductor may include various other materials.

In an embodiment, each of the light emitting elements LD may further include an additional layer or an additional electrode (not shown) disposed at one end portion or an end portion or the other end portion or another end portion in addition to the above-described cathode SM1, active layer ACTL, and anode SM2. The additional electrode may be an ohmic contact electrode, but is not limited thereto. In an embodiment, the additional electrode may be a schottky contact electrode. The additional electrode may include a conductive material. For example, the additional electrode may include a transparent conductive oxide such as an indium tin oxide (ITO), an indium zinc oxide (IZO), a zinc oxide (ZnO), an indium gallium zinc oxide (IGZO), and an indium tin zinc oxide (ITZO), but is not limited thereto.

The partition wall SPC may have a structure in which the second semiconductor layer SM2L, the active layer ACTL, and the first semiconductor layer SM1L may be stacked each other. A thickness of the first semiconductor layer SM1L of the partition wall SPC may be greater than that of the anode SM2 of the light emitting elements LD. In an embodiment, the partition wall SPC may further include a first mask pattern MP1 disposed on the first semiconductor layer SM1L. The partition wall SPC may include holes corresponding to the pixels PXL1, PXL2, and PXL3, and the light emitting elements LD corresponding to the pixels PXL1, PXL2, and PXL3 are disposed in the holes. In an embodiment, only one light emitting element LD is dispose in one hole, but in an embodiment, light emitting elements LD may be disposed in one hole.

An inner wall of the hole of the partition wall SPC and an outer side surface (planar direction) of the light emitting elements LD may be covered with or overlapped by the passivation film PSV. An upper portion of the partition wall SPC and an upper portion of the light emitting elements LD may not be covered with or overlapped by the passivation film PSV. The passivation film PSV is an insulating film, and may prevent an electrical short circuit that may occur in case that the active layer ACT contacts conductive materials other than the cathode and the anode. The passivation film PSV may minimize surface defects of each light emitting element LD to improve lifespan and luminous efficiency of each light emitting element LD. In case that the light emitting elements LD are closely disposed, the passivation film PSV may prevent unwanted short circuits that may occur between the light emitting elements LD. For example, the passivation film PSV may be a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

A connection electrode CTE may cover or overlap the inner wall of the partition wall SPC, the circuit substrate CSUB, and the light emitting element LD in the holes of the partition wall SPC. For example, the connection electrode CTE may contact the passivation film PSV, the circuit substrate CSUB, and the cathode SM1 of the light emitting element LD. The connection electrode CTE may include a transparent conductive oxide such as an indium tin oxide (ITO), an indium zinc oxide (IZO), a zinc oxide (ZnO), an indium gallium zinc oxide (IGZO), and an indium tin zinc oxide (ITZO), but is not limited thereto.

The connection electrode CTE may connect the cathode SM1 of the light emitting element LD and a first contact point CTP1 of the circuit substrate CSUB. The first contact point CTP1 may be made of a conductive material. For example, the connection electrode CTE may connect the cathode SM1 of the light emitting element LD and the first electrode of the first transistor T1 of the pixel circuit PXC (see FIG. 2).

The anode SM2 of the light emitting element LD may be connected to a second contact point CTP2 of the circuit substrate CSUB through the first metal layer MTL1 and the second metal layer MTL2. The second contact point CTP2 may be made of a conductive material. For example, the second contact point CTP2 may be connected to the first power line VDDL (see FIG. 2).

The color conversion elements CCE may fill the holes of the partition wall SPC. The color conversion elements CCE may be disposed on the connection electrode CTE. The color conversion elements CCE may overlap the corresponding light emitting elements LD in the third direction Z. In the embodiment, the color conversion elements CCE may be injected into a hole of a partition wall SPC by capillary action. A high resolution display device may be realized beyond a limit of a photo process or inkjet process.

The color conversion elements CCE may include quantum dots that convert light emitted from the light emitting elements LD of each pixel PXL into light of a color. For example, the color conversion elements CCE may include quantum dots dispersed in a matrix material such as a base resin.

In the embodiment, the first to third pixels PXL1, PXL2, and PXL3 may include the light emitting elements LD that emit light of a same color. For example, the first to third pixels PXL1, PXL2, and PXL3 may include the light emitting elements LD that emit light of a third color (or blue color). The color conversion elements CCE may include quantum dots that convert blue light emitted from the light emitting element LD into white light. An absorption coefficient of the quantum dot may be increased by irradiating blue light having a relatively short wavelength in the visible light area to the quantum dots. Accordingly, light efficiency finally emitted from the pixels PXL may be improved, and simultaneously, excellent color reproducibility may be secured. The light emitting unit EMU of the first to third pixels PXL1, PXL2, and PXL3 may be formed by using the light emitting elements LD of a same color (for example, the blue color light emitting element), thereby increasing the manufacturing efficiency of the display device.

However, the disclosure is not necessarily limited thereto, the first to third pixels PXL1, PXL2, and PXL3 may include light emitting elements LD that emit light of different colors. For example, the first pixel PXL1 may include a first color (or red color) light emitting element LD, the second pixel PXL2 may include a second color (or green color) light emitting element LD, and the third pixel PXL3 may include a third color (or blue color) light emitting element LD.

The color filters CF1, CF2, and CF3 may cover or overlap the color conversion elements CCE. A full-color image may be displayed by disposing the color filters CF1, CF2, and CF3 matching respective colors of the first to third pixels PXL1, PXL2, and PXL3. The first color filter CF1 may be disposed on the color conversion element CCE corresponding to the first pixel PXL1 to selectively transmit light emitted from the first pixel PXL1. The second color filter CF2 may be disposed on the color conversion element CCE corresponding to the second pixel PXL2 to selectively transmit light emitted from the second pixel PXL2. The third color filter CF3 may be disposed on the color conversion element CCE corresponding to the third pixel PXL3 to selectively transmit light emitted from the third pixel PXL3.

In the embodiment, the first color filter CF1, the second color filter CF2, and the third color filter CF3 may be a red color filter, a green color filter, and a blue color filter respectively, but the disclosure is not limited necessarily thereto.

The first color filter CF1 may overlap the light emitting element LD and color conversion element CCE of the first pixel PXL1 in the third direction Z. The first color filter CF1 may include a color filter material that selectively transmits light of a first color (or red color). For example, in case that the first pixel PXL1 is a red pixel, the first color filter CF1 may include a red color filter material.

The second color filter CF2 may overlap the light emitting element LD and color conversion element CCE of the second pixel PXL2 in the third direction Z. The second color filter CF2 may include a color filter material that selectively transmits light of a second color (or green color). For example, in case that the second pixel PXL2 is a green pixel, the second color filter CF2 may include a green color filter material.

The third color filter CF3 may overlap the light emitting element LD and color conversion element CCE of the third pixel PXL3 in the third direction Z. The third color filter CF3 may include a color filter material that selectively transmits light of a third color (or blue color). For example, in case that the third pixel PXL3 is a blue pixel, the third color filter CF3 may include a blue color filter material.

FIG. 27 to FIG. 33 are schematic cross-sectional views of a manufacturing method of the display device of FIG. 26.

Figure 27:
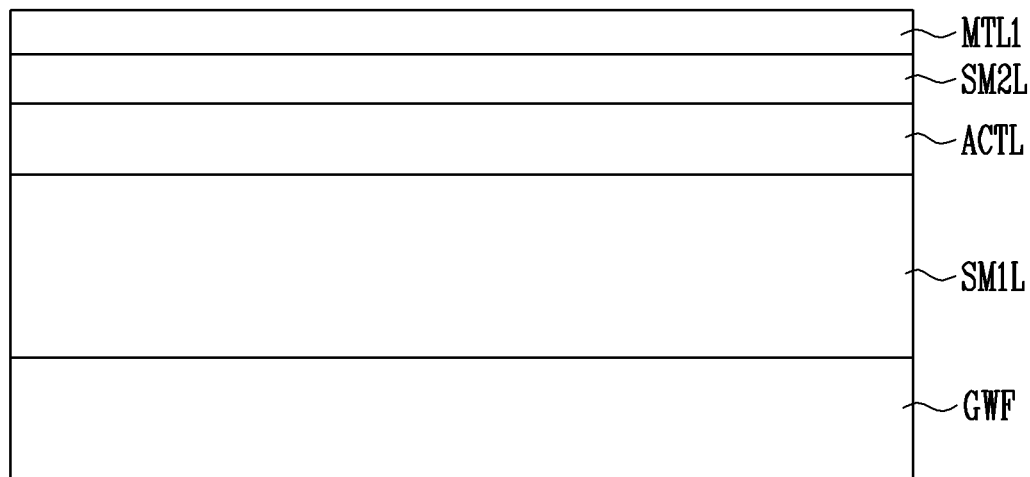
FIG. 27 to FIG. 33 are schematic cross-sectional views of a manufacturing method of the display device of FIG. 26.

Referring to FIG. 27, the first semiconductor layer SM1L, the active layer ACTL, the second semiconductor layer SM2L, and the first metal layer MTL1 may be sequentially formed on the base substrate GWF.

The base substrate GWF may be a silicon wafer. On the other hand, the base substrate GWF may be made of a light-transmitting material, for example, at least one of sapphire (AL2O3), a single crystal substrate, SiC, GaAs, GaN, ZnO, AlN, Si, GaP, InP, and Ge.

The first semiconductor layer SM1L, the active layer ACTL, and the second semiconductor layer SM2L may be referred to as a light emitting laminate (SM1L, ACTL, SM2L). The light emitting laminate (SM1L, ACTL, SM2L) may be formed by growing seed crystals by an epitaxial method. In an embodiment, the light emitting laminate (SM1L, ACTL, SM2L) may be formed by a metal organic chemical vapor deposition (MOCVD). However, the disclosure is not necessarily limited thereto, and the light emitting laminate (SM1L, ACTL, SM2L) may be formed by various methods such as an electron beam deposition, a physical vapor deposition (PVD), a chemical vapor deposition (CVD), a plasma laser deposition (PLD), a dual-type thermal evaporation, and a sputtering method.

Referring to FIG. 26, as described above, the first semiconductor layer SM1L may be an N-type semiconductor doped with an N-type dopant, and the second semiconductor layer SM2L may be a P-type semiconductor doped with a P-type dopant. A redundant description of the materials included in the light emitting laminate (SM1L, ACTL, SM2L) will be omitted.

Figure 28:
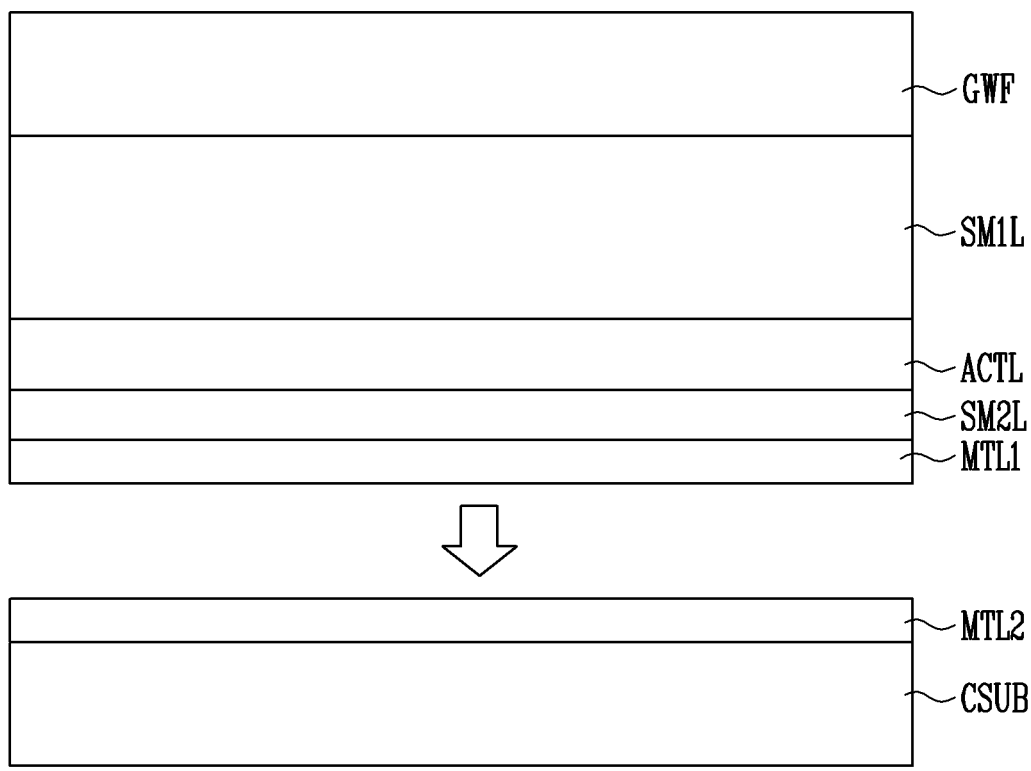
Figure 28:
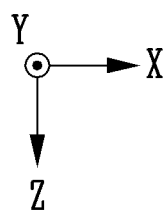

Referring to FIG. 28, the circuit substrate CSUB on which the second metal layer MTL2 may be stacked is prepared. After flipping the base substrate GWF, the first metal layer MTL1 and the second metal layer MTL2 may be bonded. The bonding may be a wafer-to-wafer (W2W) bonding. In case that the first metal layer MTL1 and the second metal layer MTL2 are made of the same material or a similar material, the first metal layer MTL1 and the second metal layer MTL2 after bonding may be expressed as one layer or a layer.

Figure 29:
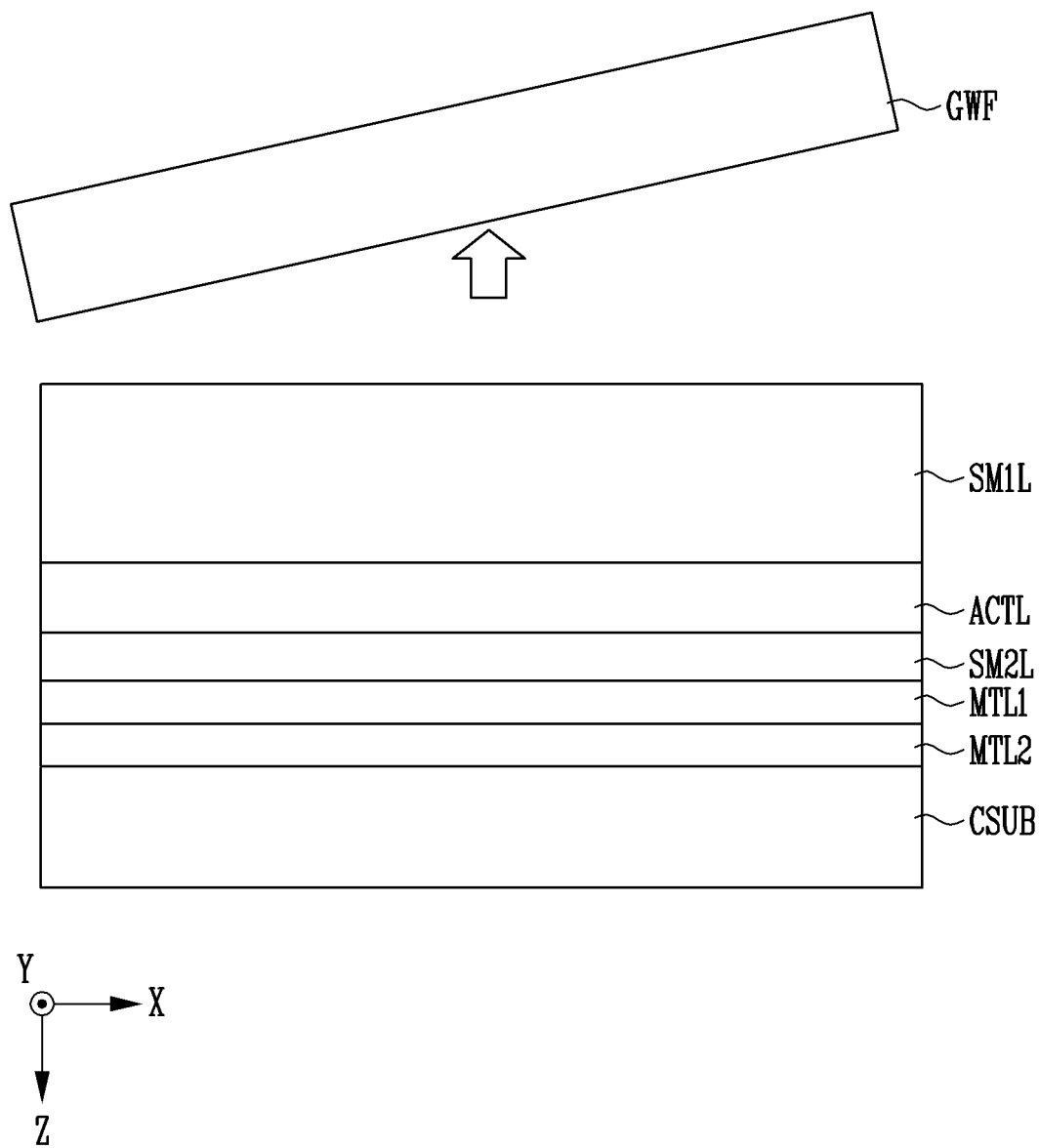

Referring to FIG. 29, after the bonding is finished, the base substrate GWF may be separated. For example, the base substrate GWF may be separated by using a laser lift off (LLO), chemical lift off (CLO), electrical lift off (ELO), or etching method. In an embodiment, at least portion of the base substrate GWF may be removed by grinding it flat.

Figure 30:
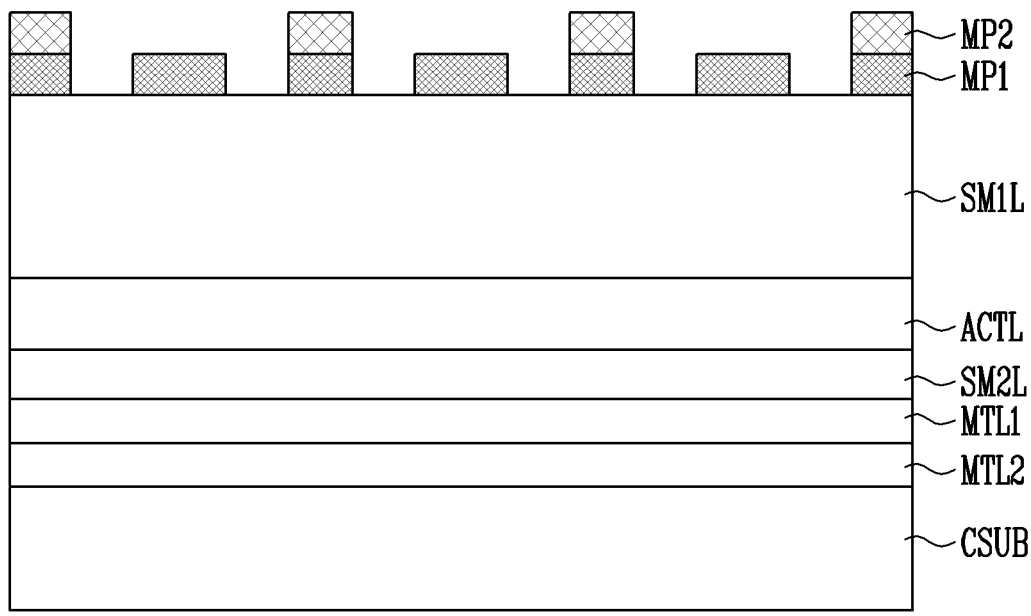

Referring to FIG. 30, the first mask pattern MP1 and the second mask pattern MP2 may be formed on the first semiconductor layer SM1L. For example, the first mask pattern MP1 may be formed on a portion in which the light emitting elements LD are to be formed. For example, the first mask pattern MP1 and the second mask pattern MP2 may be formed in a portion in which the partition wall SPC is to be formed. Since a width of the light emitting element LD is wider than that of the partition wall SPC, a width of the first mask pattern MP1 formed in the area in which the light emitting element LD is to be formed may be wider than that of the first mask pattern MP1 formed in the area in which the partition wall SPC is to be formed.

The first mask pattern MP1 and the second mask pattern MP2 may be materials with different etching ratios. For example, the first mask pattern MP1 may be made of silicon oxide ($SiO_x$). The first mask pattern MP1 may be formed of an inorganic film such as a silicon oxide film ($SiO_2$), an aluminum oxide film ($Al_2O_3$), or hafnium oxide ($HfO_x$). The second mask pattern MP2 may include a conductive material such as nickel (Ni). In another example, the second mask pattern MP2 may be made of an insulating material having a different etching ratio from that of the first mask pattern MP1.

Figure 31:
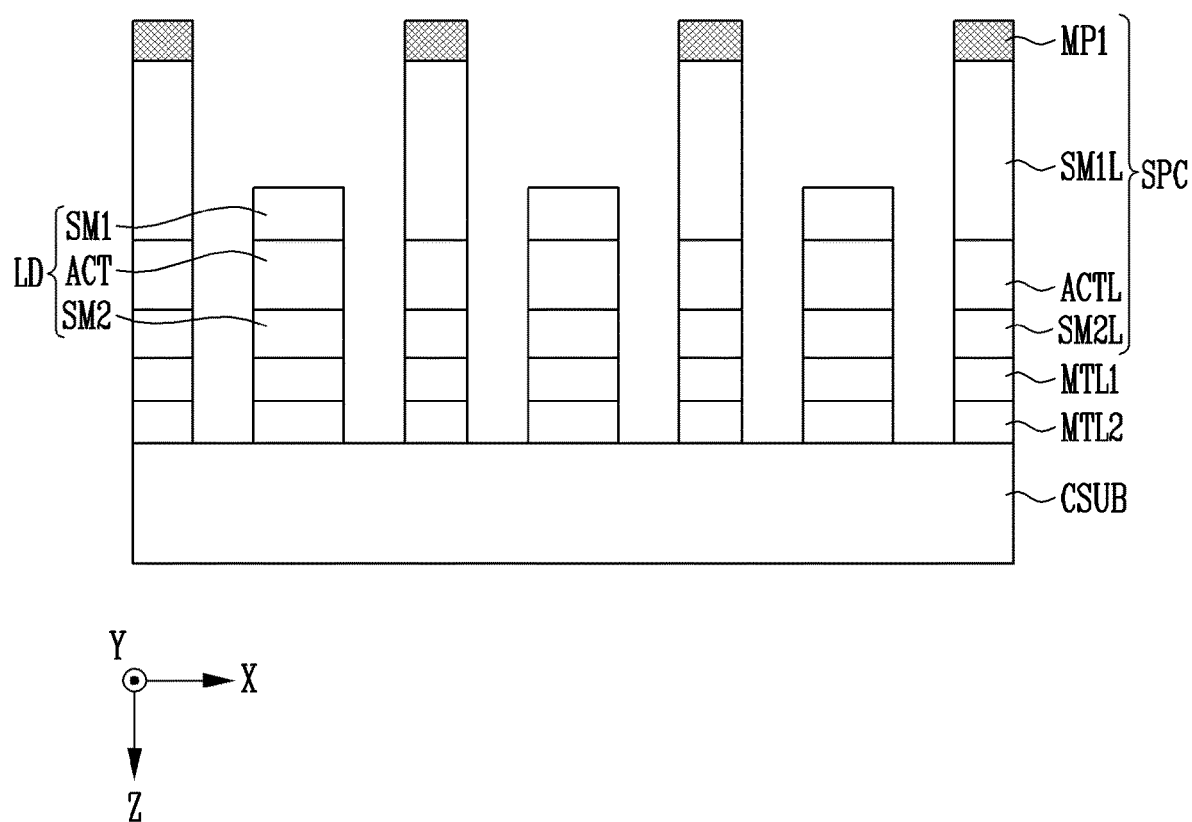

Referring to FIG. 31, the light emitting laminate (SM1L, ACTL, SM2L) may be first dry-etched according to the first mask pattern MP1 and the second mask pattern MP2. By way of example, the second mask pattern MP2 may not be etched by an etching gas used for dry-etching. Accordingly, the light emitting laminate (SM1L, ACTL, SM2L) in the area in which the second mask pattern MP2 is disposed is not etched, and thus the partition wall SPC may be formed.

The etching ratio of the light emitting laminate (SM1L, ACTL, SM2L) by the etching gas used for dry-etching may be higher than that of the first mask pattern MP1. Accordingly, since the light emitting laminate (SM1L, ACTL, SM2L) remain in the area in which the first mask pattern MP1 is disposed, the light emitting elements LD may be formed. In the area in which the first mask pattern MP1 is not disposed, the light emitting laminate (SM1L, ACTL, SM2L) are completely removed, so that the first metal layer MTL1 may be exposed.

The circuit substrate CSUB may be exposed by etching the first metal layer MTL1 and the second metal layer MTL2 through etching. In an embodiment, the second mask pattern MP2 made of metal may also be etched. In case that the second mask pattern MP2 is made of an insulating material, the etching of the second mask pattern MP2 may be unnecessary.

Figure 32:
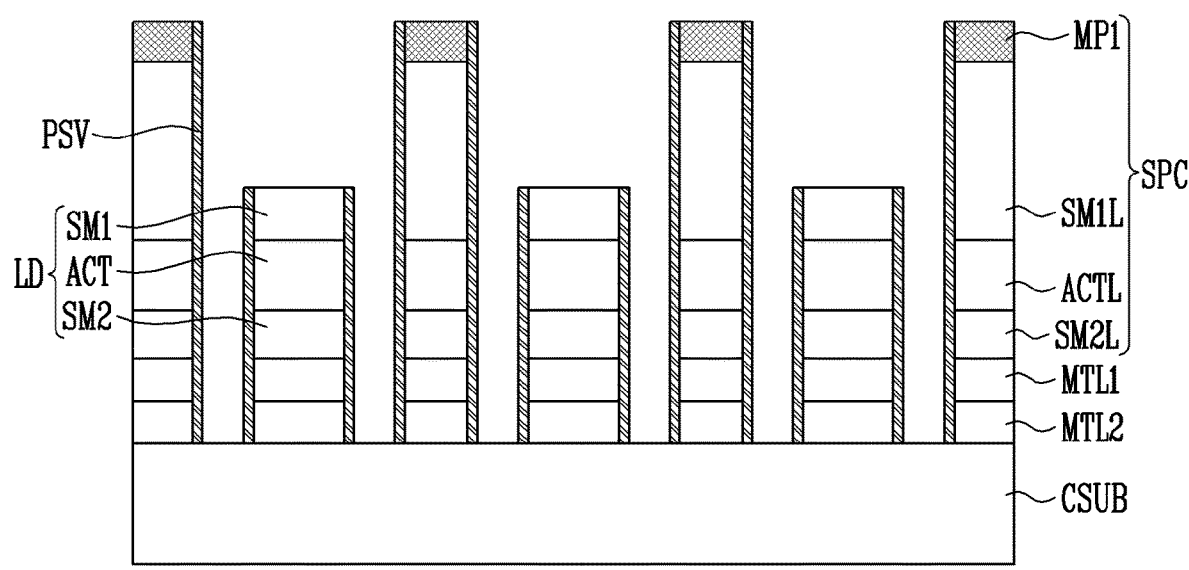

Referring to FIG. 32, by forming an insulating film and vertical-etching the insulating film, the passivation film PSV may be formed on the side surfaces of the light emitting elements LD, the inner walls of the holes of the partition wall SPC, and the inner walls of the holes of the first and second metal layers MTL1 and MTL2. Since the insulating film is vertical-etched, the passivation film PSV does not remain on the upper portions of the partition wall SPC and the light emitting elements LD. The circuit substrate CSUB is exposed between the partition wall SPC and the light emitting elements LD. During the vertical-etching, a separate mask is unnecessary, so the process cost may be reduced.

Figure 33:
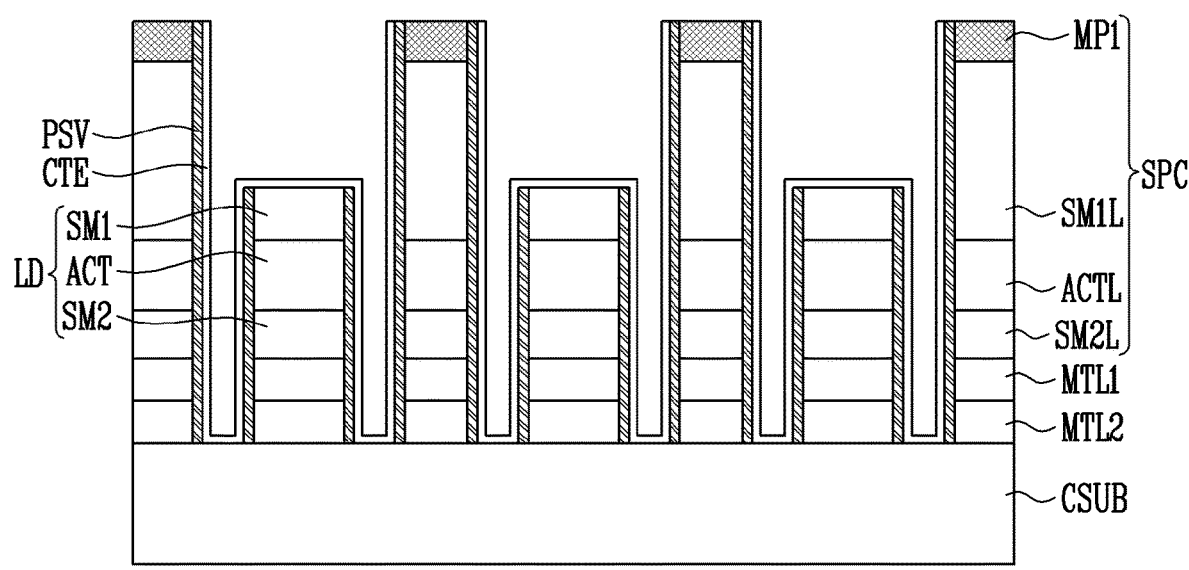

Referring to FIG. 33, the connection electrode CTE may be formed by forming a conductive layer on the front surface of the display panel PNL and etching the conductive layer on the upper portion of the partition wall SPC. The connection electrode CTE may be made of one of the above-described transparent conductive materials.

The color conversion elements CCE may be formed inside the holes of the partition wall SPC. For example, the color conversion elements CCE may be injected into the holes by capillary action. In an embodiment, the color conversion elements CCE may be formed by using inkjet printing or photo resist.

The display device of FIG. 26 may be completed by forming the color filters CF1, CF2, and CF3 covering or overlapping the color conversion elements CCE.

Figure 34:
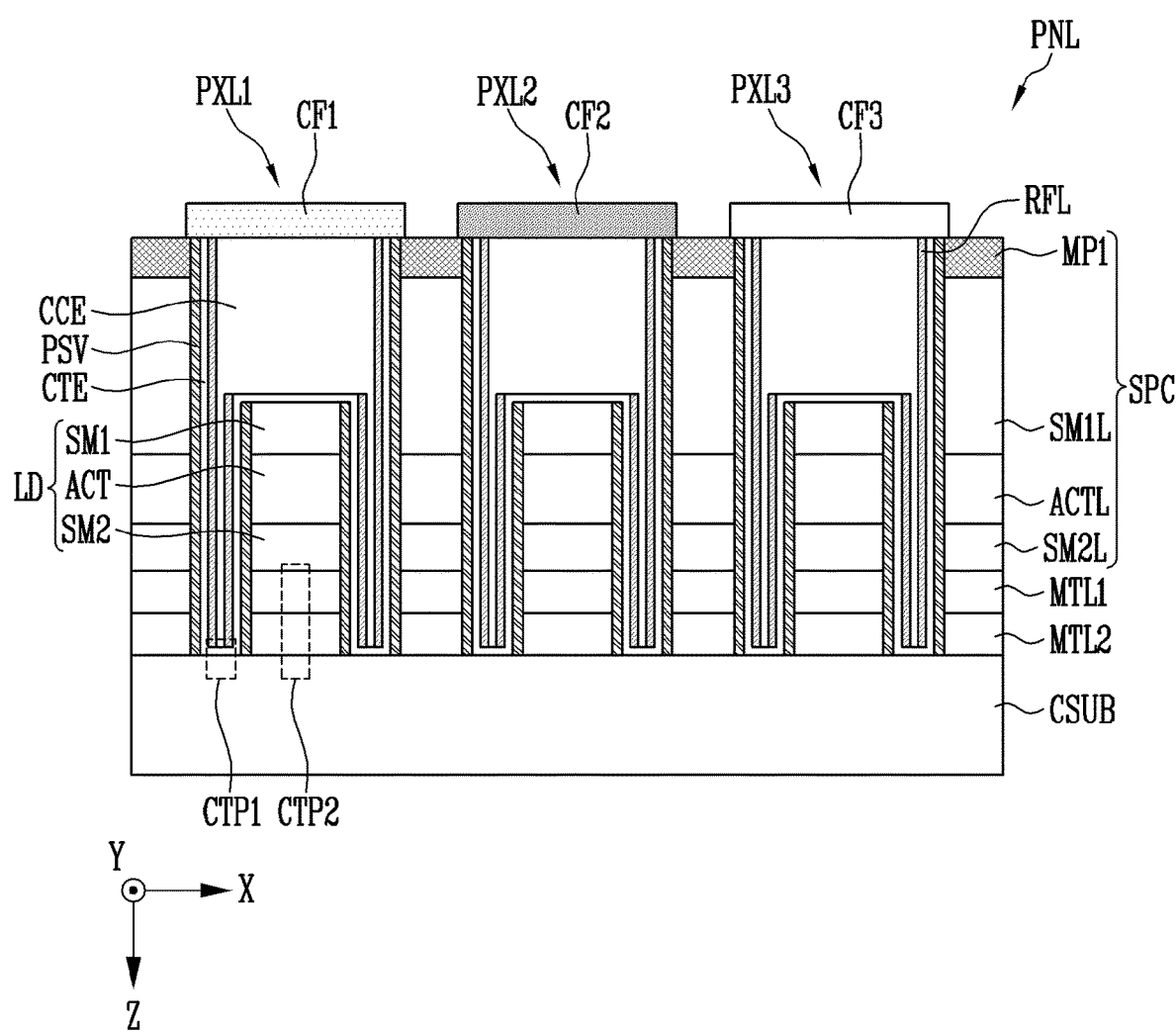
FIG. 34 is a schematic cross-sectional view of a variation of the embodiments of FIG. 26 to FIG. 33.

FIG. 34 is a schematic cross-sectional view of a variation of the embodiments of FIG. 26 to FIG. 33.

Referring to FIG. 34, compared to FIG. 26, the display panel PNL may further include a reflective member RFL.

The reflective member RFL may cover or overlap the side surfaces of the light emitting elements LD and the side surfaces of the color conversion elements CCE. For example, the reflective member RFL may be formed on the connection electrode CTE covering or overlapping the side surfaces of the light emitting elements LD and the side surfaces of the color conversion elements CCE. A thickness of the reflective member RFL may be 1 nm to 100 nm, but is not limited thereto. The reflective member RFL may include a reflective material. For example, the reflective member RFL may include an aluminum (Al)-based or silver (Ag)-based material, but is not limited thereto. The reflective member RFL reflects the light emitted from the light emitting element LD in a display direction (for example, the third direction Z) of the display device, thereby improving luminous efficiency.

In case that the display panel PNL may include the reflective member RFL, a step of forming the reflective member RFL may be added after forming the connection electrode CTE among the manufacturing steps of FIG. 33. For example, by forming the reflective material on the front surface of the display panel PNL and vertical-etching the reflective material, the reflective member RFL may be formed. During the vertical-etching, a separate mask is unnecessary, so the process cost may be reduced.

While this disclosure has been described in connection with what is considered to be described embodiments, it is to be understood that the disclosure is not limited to the disclosed embodiments, but, on the contrary, is intended to cover various modifications and equivalent arrangements included within the spirit and scope of the disclosure and the appended claims. Therefore, those skilled in the art will understand that various modifications and other equivalent embodiments are possible. Consequently, the scope of the disclosure may be determined based on the spirit and scope of the appended claims.

What is claimed is:

1. A display device comprising:
a common electrode;
light emitting elements including anodes commonly and electrically connected to the common electrode;
first contact electrodes respectively electrically connected to cathodes of the light emitting elements;
a circuit substrate; and
second contact electrodes disposed on the circuit substrate and respectively electrically connected to the first contact electrodes and the common electrode, wherein
the common electrode is electrically connected to a first power line of the circuit substrate through a corresponding one of the second contact electrodes, and
the cathodes of the light emitting elements are electrically connected to a first electrode of a driving transistor of the circuit substrate through a corresponding one of the first contact electrodes and a corresponding one of the second contact electrodes.

2. The display device of claim 1, wherein second electrodes of driving transistors of the circuit substrate are commonly and electrically connected to a second power line.

3. The display device of claim 2, wherein a voltage applied to the first power line is greater than a voltage applied to the second power line during a light emitting period of the light emitting elements.

4. A display device comprising:
a common electrode;
light emitting elements including anodes commonly and electrically connected to the common electrode;
first contact electrodes respectively electrically connected to cathodes of the light emitting elements;
a circuit substrate;
second contact electrodes disposed on the circuit substrate and respectively electrically connected to the first contact electrodes and the common electrode;
a connection electrode electrically connecting the anodes of the light emitting elements to the common electrode;
a first insulation layer overlapping the connection electrode;
color conversion elements disposed on the first insulation layer and overlapping the light emitting elements;
color filters overlapping the color conversion elements;
a bank surrounding side surfaces of the color conversion elements;
a light block layer overlapping the bank, the light block layer including openings exposing the color filters; and
a second insulation layer overlapping the light block layer and the color filters.

5. A display device comprising:
a common electrode;
light emitting elements including anodes commonly and electrically connected to the common electrode;
first contact electrodes respectively electrically connected to cathodes of the light emitting elements;
a circuit substrate;
second contact electrodes disposed on the circuit substrate and respectively electrically connected to the first contact electrodes and the common electrode;
a connection electrode electrically connecting the anodes of the light emitting elements to the common electrode;
a first insulation layer overlapping the connection electrode;
color conversion elements disposed on the first insulation layer and overlapping the light emitting elements;
color filters overlapping the color conversion elements;
a first metal layer disposed on the first insulation layer;
a second metal layer disposed on the first metal layer; and
a carrier substrate disposed on the second metal layer, wherein
the first metal layer, the second metal layer, and the carrier substrate include holes, and
the color conversion elements are disposed in the holes.

6. The display device of claim 5, wherein the color filters overlap the color conversion elements on the carrier substrate.

* * * * *